US012656828B2

(12) United States Patent
Lee et al.

(10) Patent No.: US 12,656,828 B2
(45) Date of Patent: Jun. 16, 2026

(54) DISPLAY DEVICE

(71) Applicant: Samsung Display Co., LTD., Yongin-si (KR)

(72) Inventors: Sangjun Lee, Yongin-si (KR); Beomjin Kim, Yongin-si (KR); Jaeho Ahn, Yongin-si (KR); Cheol Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 106 days.

(21) Appl. No.: 18/601,189

(22) Filed: Mar. 11, 2024

(65) Prior Publication Data

US 2025/0028362 A1 Jan. 23, 2025

(30) Foreign Application Priority Data

Jul. 19, 2023 (KR) ......................... 10-2023-0093771

(51) Int. Cl.
*G06F 1/16* (2006.01)
*H10K 77/10* (2023.01)
*H10K 102/00* (2023.01)

(52) U.S. Cl.
CPC .......... *G06F 1/1652* (2013.01); *H10K 77/111* (2023.02); *H10K 2102/311* (2023.02)

(58) Field of Classification Search
CPC ............ H10K 77/111; H10K 2102/311; G06F 1/1652
See application file for complete search history.

(56) References Cited

U.S. PATENT DOCUMENTS

| 10,264,687 B2 | 4/2019 | Choi et al. | |
| 10,856,426 B2 | 12/2020 | Jeon | |
| 2016/0187929 A1* | 6/2016 | Kim ...................... | G06F 1/1643 |
| | | | 345/184 |
| 2019/0098776 A1* | 3/2019 | Jeon ........................ | G09F 9/301 |
| 2022/0253104 A1 | 8/2022 | Luo et al. | |
| 2023/0122526 A1* | 4/2023 | Dong .................... | G06F 1/1652 |
| | | | 361/679.27 |

FOREIGN PATENT DOCUMENTS

| CN | 111462635 A | 7/2020 |
| CN | 214504836 U | 10/2021 |
| KR | 101773443 B1 | 9/2017 |
| KR | 102366366 B1 | 2/2022 |
| KR | 102546825 B1 | 6/2023 |

* cited by examiner

*Primary Examiner* — Sagar Shrestha
*Assistant Examiner* — Peter Krim
(74) *Attorney, Agent, or Firm* — CANTOR COLBURN LLP

(57) ABSTRACT

A display device includes a first roller in which a cavity extending in a first direction is defined and including an end surface and an opposite end surface facing each other at an incision extending in the first direction, a step adjustment part that is disposed in the cavity and that adjusts a step between the end surface and the opposite end surface by a rotary motion, and a display module connected to the first roller and wound around an outer circumferential surface of the first roller.

19 Claims, 23 Drawing Sheets

NDA　　　　DA　　　　NDA

RPL
ISP  } EP
DP

DP

NDA　　　DA　　　NDA

TFE　　DP-OLED

DP-CL
SUB

FIG. 13

DISPLAY DEVICE

This application claims priority to Korean Patent Application No. 10-2023-0093771, filed on Jul. 19, 2023, and all the benefits accruing therefrom under 35 U.S.C. § 119, the content of which in its entirety is herein incorporated by reference.

BACKGROUND

1. Field

Embodiments of the disclosure described herein relate to a display device.

2. Description of the Related Art

An electronic device, such as a smart phone, a digital camera, a notebook computer, a car navigation unit, a smart television, or the like, which provides an image to a user includes a display device for displaying an image. The display device generates an image and provides the image to the user through a display screen.

With development of display device technology, various forms of display devices are being developed. For example, various flexible display devices that may be curved, folded, or rolled are being developed. The flexible display devices may be easy to carry and may improve user convenience.

Among the flexible display devices, a rollable display device includes a display module, a roller around which the display module is wound, and a housing that accommodates the display module and the roller. The display module may be extracted from or inserted into the housing by rotation of the roller.

SUMMARY

Embodiments of the disclosure provide a display device for preventing damage to a display module and adjusting the size of a step portion of a roller in various ways depending on the thickness of the display module.

In an embodiment, a display device includes a first roller in which a cavity extending in a first direction is defined and including an end surface and an opposite end surface facing each other at an incision extending in the first direction, a step adjustment part that is disposed in the cavity and that adjusts a step between the one end surface and the opposite end surface by a rotary motion, and a display module connected to the first roller and wound around an outer circumferential surface of the first roller.

In an embodiment, a display device includes a first roller in which a cavity extending in a first direction is defined and a cut made in the first roller in the first direction, a second roller that is disposed in the cavity and that includes a first circular arc having a variable curvature and a second circular arc extending from the first circular arc and defines a step portion together with the first circular arc, the second circular arc having a curvature which is constant or variable, and a display module connected to the first roller and wound around an outer circumferential surface of the first roller.

BRIEF DESCRIPTION OF THE DRAWINGS

The above and other objects and features of the present disclosure will become apparent by describing in detail embodiments thereof with reference to the accompanying drawings.

FIG. 13 is a cross-sectional view taken along line II-II' illustrated in FIG. 2.

DETAILED DESCRIPTION

Figure 1:
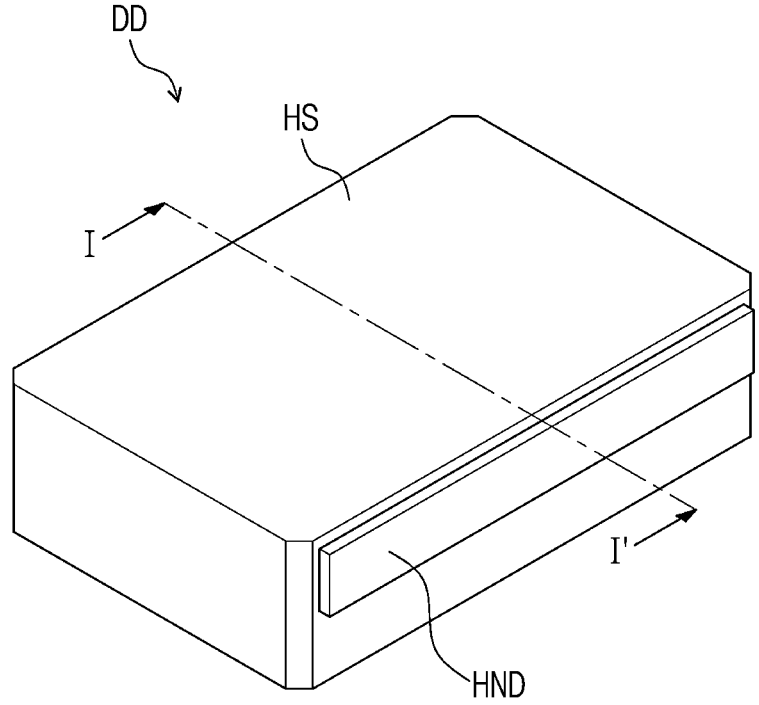
FIG. 1 is a perspective view of an embodiment of a display device according to the disclosure.
Figure 1:
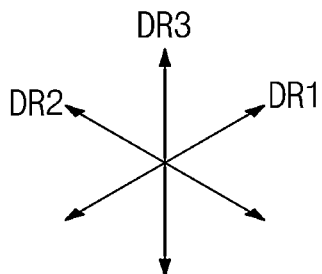

In this specification, when it is mentioned that a component (or an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description.

As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

Unless otherwise defined, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments of the disclosure will be described with reference to the accompanying drawings.

Figure 2:
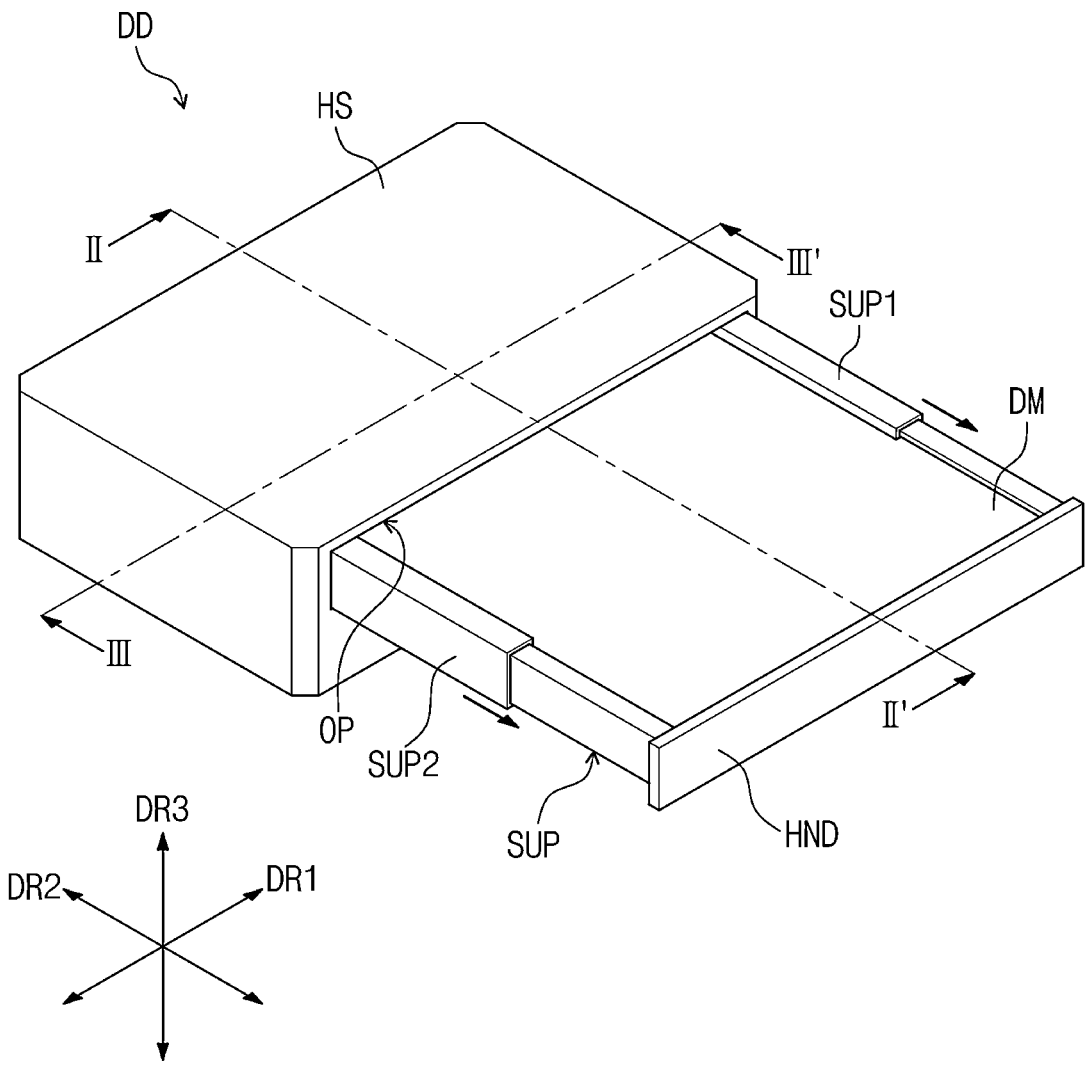
FIG. 2 is a view illustrating a display module pulled out of a housing illustrated in FIG. 1.

FIG. 1 is a perspective view of an embodiment of a display device according to the disclosure. FIG. 2 is a view illustrating a display module pulled out of a housing illustrated in FIG. 1.

Referring to FIGS. 1 and 2, the display device DD in an embodiment of the disclosure may include the housing HS, the display module DM accommodated in the housing HS, a handle HND connected to the display module DM, and a support part SUP adjacent to opposite sides of the display module DM.

The housing HS may have a hexahedral shape. However, the shape of the housing HS is not limited thereto. A first direction DR1 and a second direction DR2 may be defined as directions crossing each other. The housing HS may extend longer in the first direction DR1 than in the second direction DR2.

Hereinafter, a direction substantially perpendicular to a plane defined by the first and second directions DR1 and DR2 is defined as a third direction DR3. As used herein, the expression "when viewed from above the plane" may mean that it is viewed in the third direction DR3.

An opening OP may be defined on one side of the housing HS in the second direction DR2. The opening OP may be closer to an upper portion of the housing HS than to a lower portion of the housing HS.

The display module DM may be wound around a roller disposed in the housing HS and may be inserted into and extracted from the housing HS through the opening OP. However, without being limited thereto, the display module DM may be pulled out of the housing HS by sliding from the inside of the housing HS to the outside without using the roller. The configuration in which the display module DM is wound around the roller will be described below in detail.

The handle HND may be disposed on the outside of the housing HS and may be adjacent to the opening OP. The handle HND may be adjacent to the upper portion of the housing HS. The handle HND may extend in the first direction DR1 and may move relative to the housing HS in the second direction DR2. When the handle HND moves away from the housing HS in the second direction DR2, the display module DM may be pulled out of the housing HS through the opening OP. The handle HND may be operated by a user.

A state in which the display module DM is disposed in the housing HS and is not exposed to the outside as illustrated in FIG. 1 may be defined as a closed mode. An operation in which the display module DM is exposed outside the housing HS as illustrated in FIG. 2 may be defined as an open mode. In the open mode, the exposed area of the display module DM may be adjusted. In the open mode, the exposed portion of the display module DM may be extended.

The support part SUP may be disposed on the opposite sides of the display module DM that face away from each other in the first direction DR1 and may support the display module DM. This configuration will be described below in detail. The support part SUP may include a first support part SUP1 adjacent to one side of the display module DM and a second support part SUP2 adjacent to an opposite side of the display module DM. The one side of the display module DM and the opposite side of the display module DM may be the opposite sides of the display module DM that face away from each other in the first direction DR1.

Figure 3:
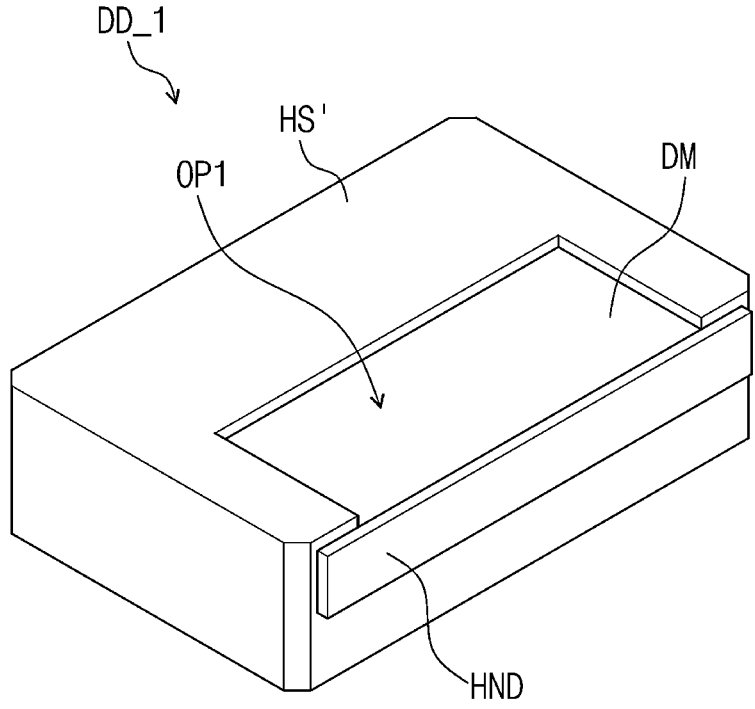
FIGS. 3 and 4 are perspective views of an embodiment of a display device according to the disclosure.
Figure 3:
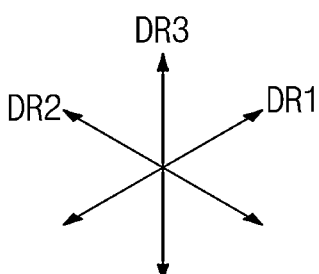
Figure 4:
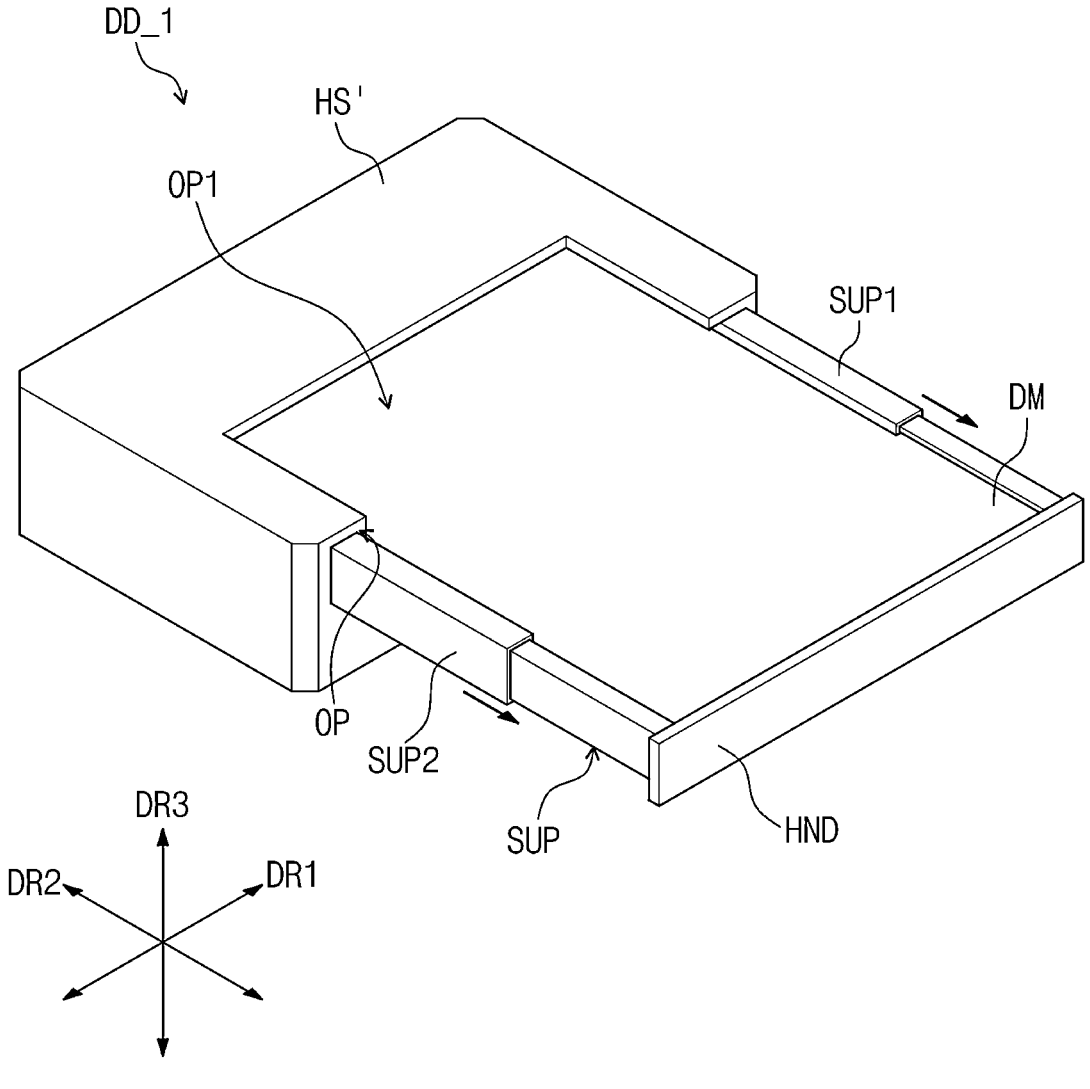

FIGS. 3 and 4 are perspective views of an embodiment of a display device according to the disclosure.

The display device DD_1 illustrated in FIGS. 3 and 4 may have the same components as those of the display device DD illustrated in FIGS. 1 and 2, except for a housing HS'. Accordingly, the following description will be focused on the housing HS'.

Referring to FIGS. 3 and 4, a first opening OP1 for exposing a predetermined portion of a display module DM may be defined in an upper surface of the housing HS'. The first opening OP1 may be adjacent to a handle HND. The first opening OP1 may be defined to be continuous with an opening OP through which the display module DM is inserted into and extracted from the housing HS'.

An image may be displayed through a portion of the display module DM exposed through the first opening OP1. In the display device DD illustrated in FIG. 1, the display module DM is disposed in the housing HS and is not exposed to the outside, whereas in the display device DD_1 illustrated in FIG. 3, a portion of the display module DM may be exposed to the outside. When the handle HND moves away from the housing HS' in the second direction DR2, the exposed portion of the display module DM may be extended.

Figure 5:
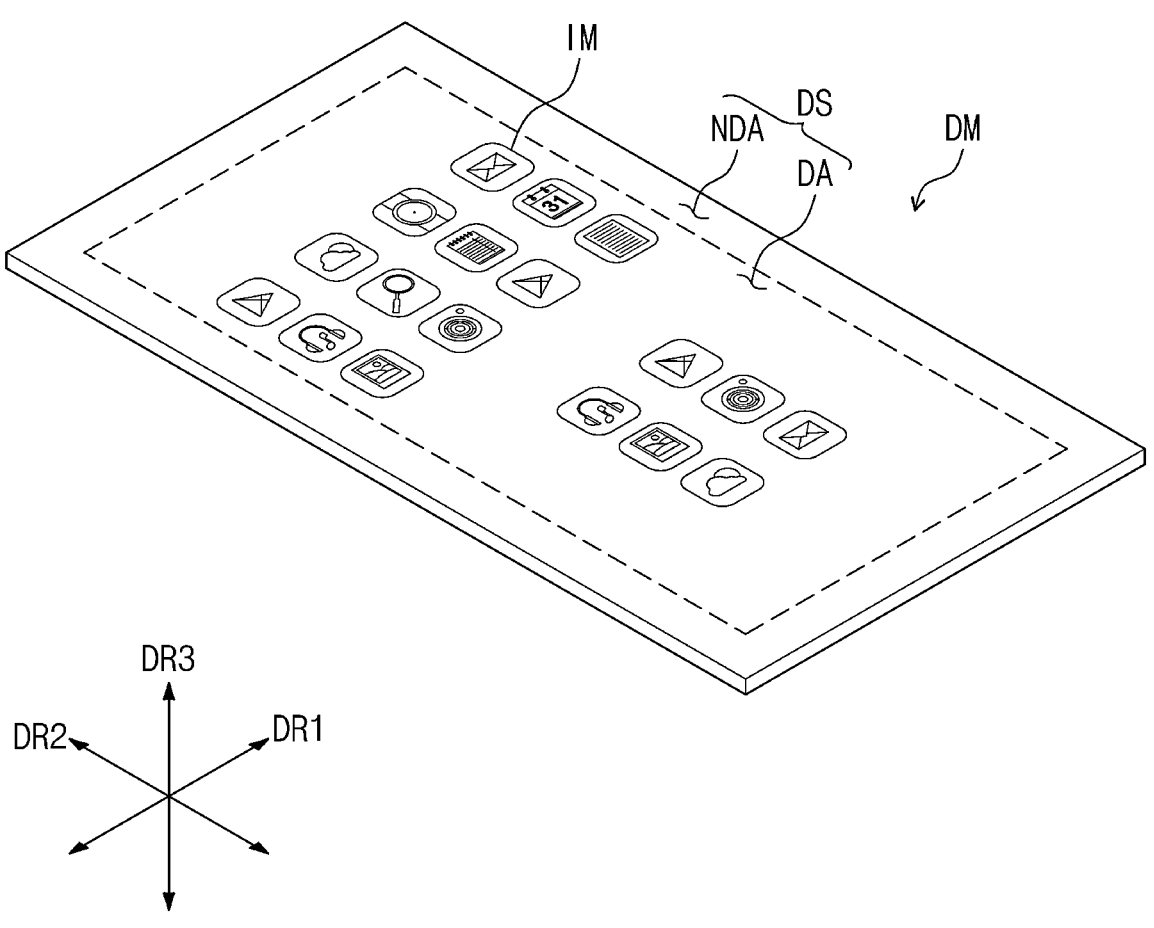
FIG. 5 is a view illustrating a flat state of the display module accommodated in the housing illustrated in FIG. 1.
Figure 6:
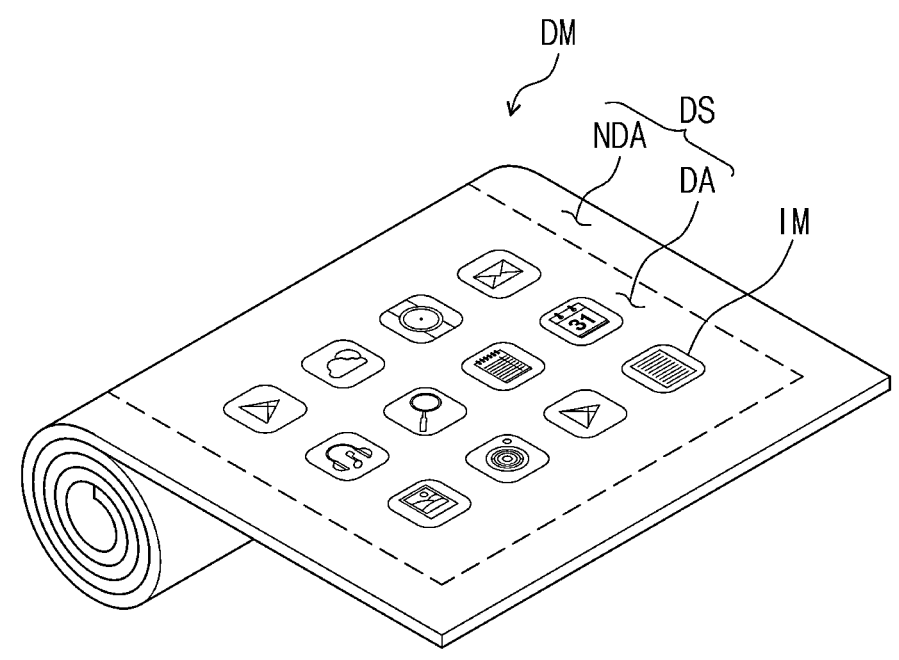
FIG. 6 is a view illustrating a rolled state of the display module illustrated in FIG. 5.
Figure 6:
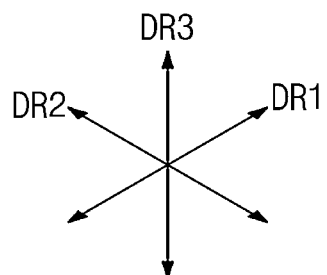

FIG. 5 is a view illustrating a flat state of the display module accommodated in the housing illustrated in FIG. 1. FIG. 6 is a view illustrating a rolled state of the display module illustrated in FIG. 5.

Referring to FIG. 5, the display module DM may have a plane defined by the first and second directions DR1 and DR2. The display module DM may have a quadrangular shape, e.g., rectangular shape with long sides extending in the second direction DR2 and short sides extending in the first direction DR1. However, without being limited thereto, the display module DM may have various shapes such as a circular shape, a polygonal shape, or the like.

An upper surface of the display module DM may be defined as a display surface DS and may have a plane defined by the first direction DR1 and the second direction DR2. An image IM generated by the display module DM may be provided to the user through the display surface DS.

The display surface DS may include a display region DA and a non-display region NDA around the display region DA. The display region DA may display an image, and the non-display region NDA may not display an image. The non-display region NDA may surround the display region DA and may define the border of the display module DM that is printed in a predetermined color.

Referring to FIG. 6, the display module DM may be a flexible display module. The display module DM may be rolled or unrolled in the second direction DR2. The display module DM may be rolled such that the display surface DS faces toward the outside. A state in which the display module DM is rolled inside the housing HS will be described below in detail.

Figure 7:
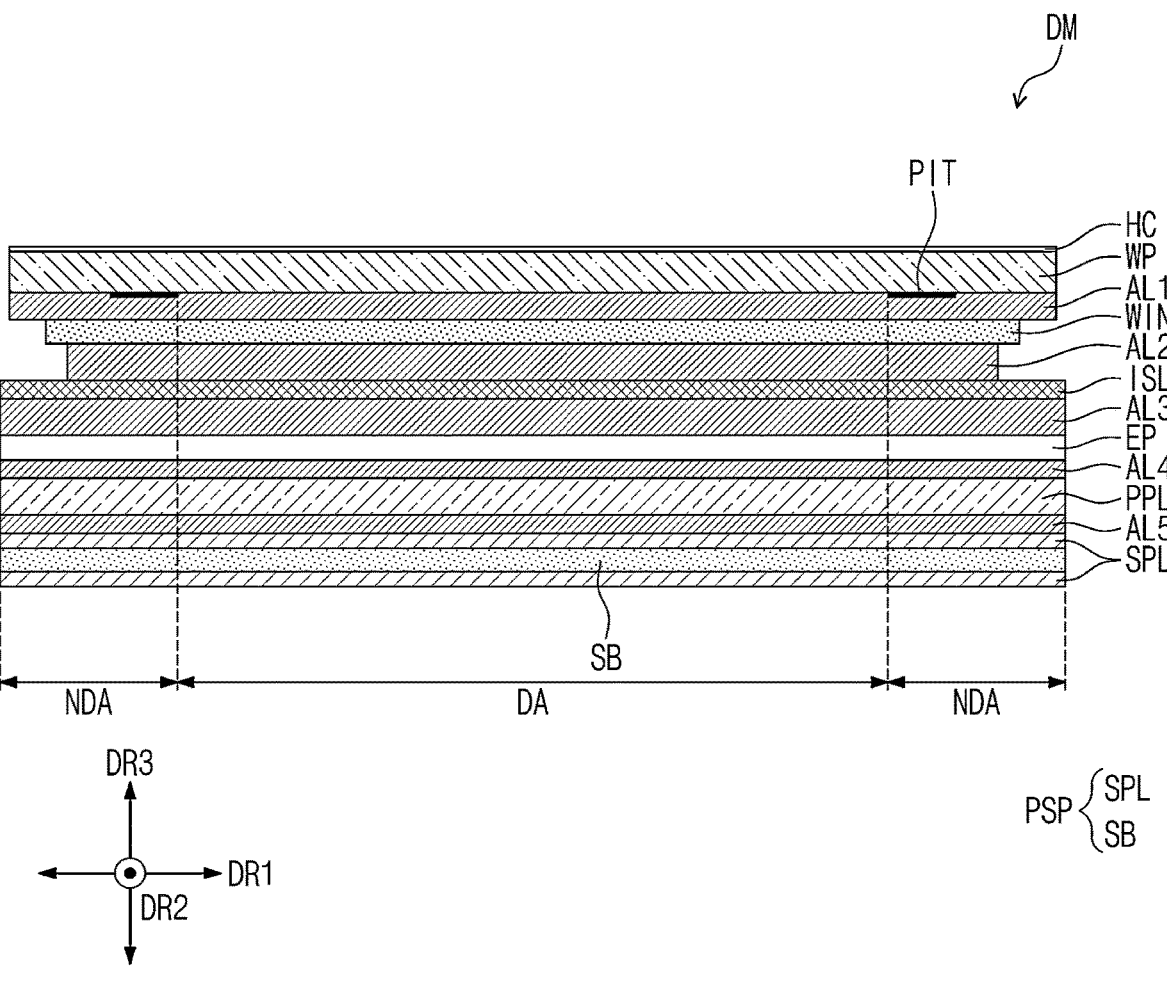
FIG. 7 is a view illustrating a section of the display module illustrated in FIG. 5.
Figure 8:
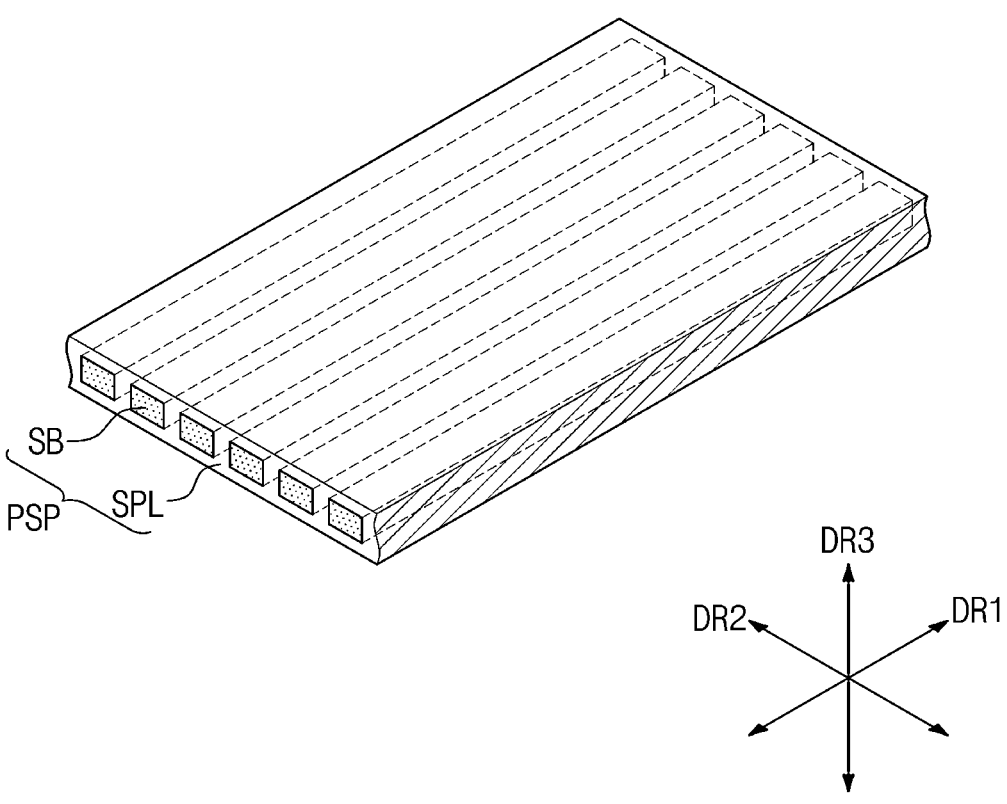
FIG. 8 is a view illustrating a support layer illustrated in FIG. 7 and support bars disposed in the support layer.

FIG. 7 is a view illustrating a section of the display module illustrated in FIG. 5. FIG. 8 is a view illustrating a support layer illustrated in FIG. 7 and support bars disposed in the support layer.

In FIG. 7, a section of the display module DM viewed in the second direction DR2 is illustrated.

Referring to FIGS. 7 and 8, the display module DM may include an electronic panel EP, an impact absorbing layer ISL, a panel protection layer PPL, a window WIN, a window protection layer WP, a hard coating layer HC, a panel support layer PSP, and first to fifth adhesive layers AL1 to AL5.

The electronic panel EP may display an image. The electronic panel EP may include a display panel, an input sensing unit, and an anti-reflection layer, and the components of the electronic panel EP will be described below with reference to FIG. 9.

The impact absorbing layer ISL may be disposed on the electronic panel EP. The impact absorbing layer ISL may protect the electronic panel EP by absorbing an external impact applied from above the display device DD toward the electronic panel EP. The impact absorbing layer ISL may be manufactured in the form of a stretchable film.

The impact absorbing layer ISL may include a flexible plastic material. The flexible plastic material may be defined as a synthetic resin film. In an embodiment, the impact absorbing layer ISL may include a flexible plastic material such as polyimide ("PI") or polyethylene terephthalate ("PET"), for example.

The window WIN may be disposed on the impact absorbing layer ISL. The window WIN may protect the electronic panel EP from external scratches. The window WIN may have a property of being optically clear. The window WIN may include glass. However, without being limited thereto, the window WIN may include a synthetic resin film.

The window protection layer WP may be disposed on the window WIN. The window protection layer WP may include a flexible plastic material such as polyimide or polyethylene terephthalate. The hard coating layer HC may be disposed on an upper surface of the window protection layer WP.

A printed layer PIT may be disposed on a lower surface of the window protection layer WP. The printed layer PIT may be black in color. However, the color of the printed layer PIT is not limited thereto. The printed layer PIT may be adjacent to the periphery of the window protection layer WP. The printed layer PIT may overlap the non-display region NDA.

The panel protection layer PPL may be disposed under the electronic panel EP. The panel protection layer PPL may protect a lower portion of the electronic panel EP. The panel protection layer PPL may include a flexible plastic material. In an embodiment, the panel protection layer PPL may include polyimide or polyethylene terephthalate, for example.

The panel support layer PSP may be disposed under the panel protection layer PPL. The panel support layer PSP may serve to support the electronic panel EP. The panel support layer (or also referred to as a panel support part) PSP may include the support layer SPL disposed under the panel protection layer PPL and the plurality of support bars SB disposed in the support layer SPL.

As illustrated in FIG. 8, the support bars SB may extend in the first direction DR1 and may be arranged in the second direction DR2. When viewed in the first direction DR1, the support bars SB may have a quadrilateral shape. However, the shape of the support bars SB is not limited thereto.

In FIG. 8, the support bars SB disposed in the support layer SPL are illustrated by dotted lines. The support bars SB may be spaced apart from each other at equal intervals in the second direction DR2. However, the intervals between the support bars SB are not limited thereto. Opposite ends of each support bar SB that face away from each other in the first direction DR1 may be exposed outside the support layer SPL without being disposed in the support layer SPL.

The support bars SB may be of a rigid type. In an embodiment, the support bars SB may include a metal. The support bars SB may include aluminum, stainless steel, or invar, for example.

The support layer SPL may include an elastomer having a predetermined elastic force. In an embodiment, the support layer SPL may include at least one of thermoplastic poly-urethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, and ethylene-vinyl acetate, for example.

The support bars SB may have a higher modulus than that of the support layer SPL. The support layer SPL may have a modulus of 20 kilopascals (Kpa) to 20 megapascals (MPa). The support bars SB may have a modulus of 1 gigapascals (GPa) to 200 GPa.

The support bars SB having a higher modulus than that of the support layer SPL may serve to support the electronic panel EP. The support layer SPL may provide a flat upper surface on the support bars SB. When the support bars SB are disposed under the electronic panel EP without the support layer SPL, the electronic panel EP may have a corrugated surface due to the support bars SB and may be deformed. However, the support bars SB may be disposed in the support layer SPL, and the support layer SPL may provide a flat upper surface below the electronic panel EP. Accordingly, deformation of the electronic panel EP may be prevented.

The first adhesive layer AL1 may be disposed between the window protection layer WP and the window WIN. The window protection layer WP and the window WIN may be bonded to each other by the first adhesive layer AL1. The first adhesive layer AL1 may cover the printed layer PIT.

The second adhesive layer AL2 may be disposed between the window WIN and the impact absorbing layer ISL. The window WIN and the impact absorbing layer ISL may be bonded to each other by the second adhesive layer AL2.

The third adhesive layer AL3 may be disposed between the impact absorbing layer ISL and the electronic panel EP. The impact absorbing layer ISL and the electronic panel EP may be bonded to each other by the third adhesive layer AL3.

The fourth adhesive layer AL4 may be disposed between the electronic panel EP and the panel protection layer PPL. The electronic panel EP and the panel protection layer PPL may be bonded to each other by the fourth adhesive layer AL4.

The fifth adhesive layer AL5 may be disposed between the panel protection layer PPL and the panel support layer PSP. The panel protection layer PPL and the panel support layer PSP may be bonded to each other by the fifth adhesive layer AL5.

The first to fifth adhesive layers AL1 to AL5 may include a pressure sensitive adhesive ("PSA") or an optically clear adhesive ("OCA"), but are not limited thereto.

Figure 9:
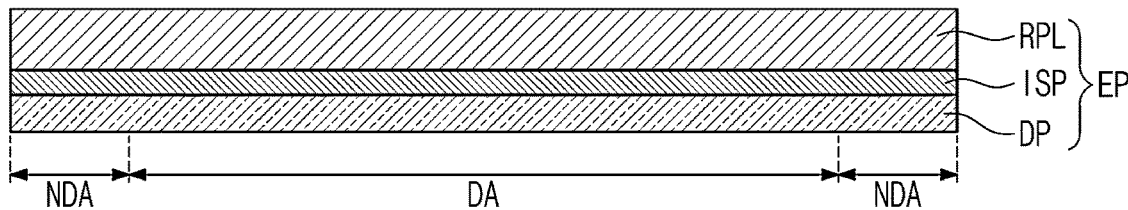
FIG. 9 is a cross-sectional view illustrating components of an electronic panel illustrated in FIG. 7.
Figure 9:
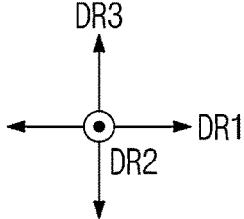

FIG. 9 is a cross-sectional view illustrating components of the electronic panel illustrated in FIG. 7.

In FIG. 9, a section of the electronic panel EP viewed in the second direction DR2 is illustrated.

Referring to FIG. 9, the electronic panel EP may include the display panel DP, the input sensing unit ISP disposed on the display panel DP, and the anti-reflection layer RPL disposed on the input sensing unit ISP. The display panel DP may be a flexible display panel. In an embodiment, the display panel DP may include a flexible substrate and a plurality of elements disposed on the flexible substrate, for example.

The display panel DP in an embodiment of the disclosure may be an emissive display panel, but is not particularly limited. In an embodiment, the display panel DP may be an organic light-emitting display panel or an inorganic light-emitting display panel, for example. An emissive layer of the organic light-emitting display panel may include an organic light-emitting material. An emissive layer of the inorganic light-emitting display panel may include quantum dots, quantum rods, or the like. Hereinafter, it will be exemplified that the display panel DP is an organic light-emitting display panel.

The input sensing unit ISP may include a plurality of sensing parts (not illustrated) for sensing an external input. In an embodiment, the input sensing unit ISP may sense an external input in a capacitive type, for example. However, a sensing method of the input sensing unit ISP is not limited thereto. The input sensing unit ISP may be directly formed on the display panel DP when the electronic panel EP is manufactured.

The anti-reflection layer RPL may be disposed on the input sensing unit ISP. The anti-reflection layer RPL may be directly formed on the input sensing unit ISP when the electronic panel EP is manufactured. The anti-reflection layer RPL may be defined as a film for preventing reflection of external light. The anti-reflection layer RPL may decrease the reflectance of external light incident toward the display panel DP from above the display device DD.

When external light travelling toward the display panel DP is reflected from the display panel DP and provided back to the user, the user may visually recognize the external light as in a mirror. To prevent such a phenomenon, the anti-reflection layer RPL may include a plurality of color filters that display the same colors as those of pixels of the display panel DP.

The color filters may filter external light into the same colors as those of the pixels. In this case, the external light may not be visible to the user. However, without being limited thereto, the anti-reflection layer RPL may include a phase retarder and/or a polarizer to decrease the reflectance of the external light.

In an embodiment, the input sensing unit ISP may be directly formed on the display panel DP, and the anti-reflection layer RPL may be directly formed on the input sensing unit ISP, for example. However, embodiments of the disclosure are not limited thereto. In an embodiment, the input sensing unit ISP may be separately manufactured and may be attached to the display panel DP by an adhesive layer, and the anti-reflection layer RPL may be separately manufactured and may be attached to the input sensing unit ISP by an adhesive layer, for example.

Figure 10:
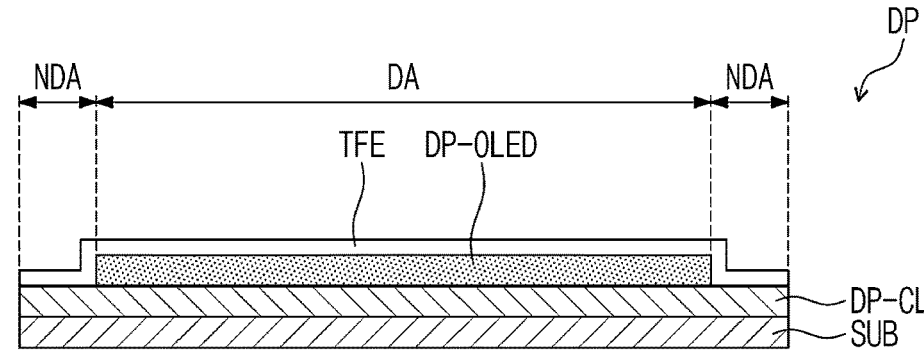
FIG. 10 is a cross-sectional view illustrating components of a display panel illustrated in FIG. 9.
Figure 10:
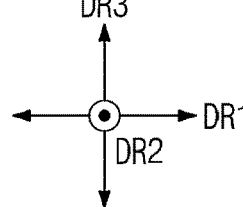

FIG. 10 is a cross-sectional view illustrating components of the display panel illustrated in FIG. 9.

In FIG. 10, a section of the display panel DP viewed in the second direction DR2 is illustrated.

Referring to FIG. 10, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. The substrate SUB may include a flexible plastic material such as polyimide. The display element layer DP-OLED may be disposed over the display region DA.

A plurality of pixels may be disposed in the display region DA. Each of the pixels may include a light-emitting element that is connected to transistors disposed in the circuit element layer DP-CL and is disposed in the display element layer DP-OLED.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect the pixels from moisture/oxygen. The organic layer may protect the pixels from foreign matter such as dust particles.

Figure 11:
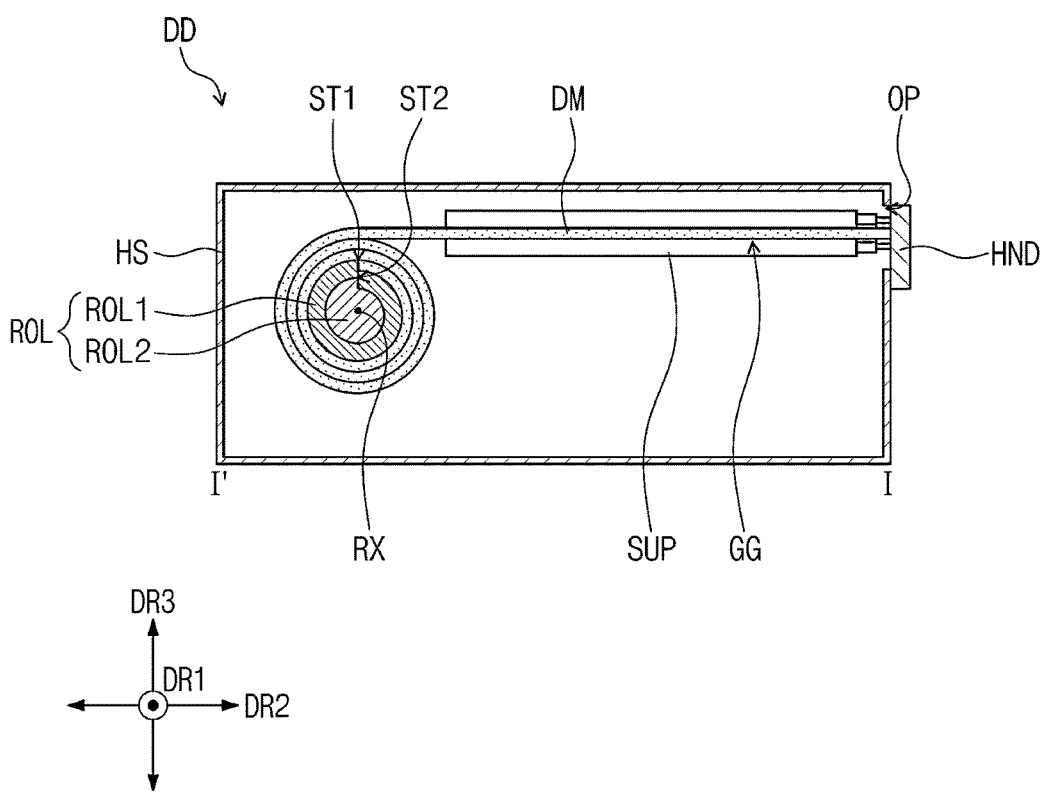
FIG. 11 is a cross-sectional view taken along line I-I' illustrated in FIG. 1.
Figure 12:
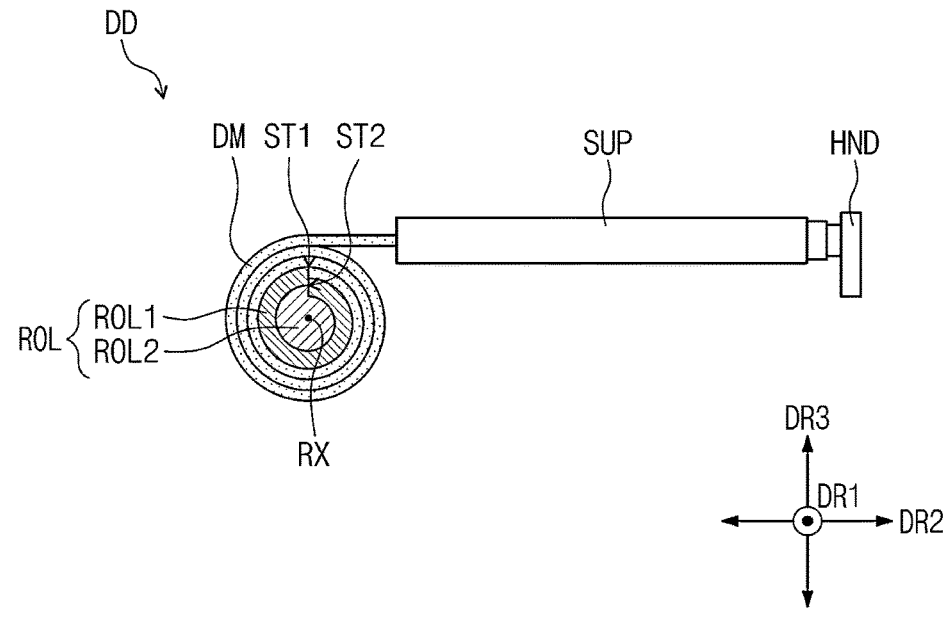
FIG. 12 is a side view illustrating the inside of the housing illustrated in FIG. 1 as viewed in a second direction.

FIG. 11 is a cross-sectional view taken along line I-I' illustrated in FIG. 1. FIG. 12 is a side view illustrating the inside of the housing illustrated in FIG. 1 as viewed in the second direction.

For convenience of description, the housing HS is omitted in FIG. 12.

Referring to FIGS. 11 and 12, the display device DD may include the housing HS, the display module DM, a roller ROL, the support part SUP, and the handle HND. The display module DM, the roller ROL, and the support part SUP may be accommodated in the housing HS.

In the housing HS, the roller ROL may be adjacent to an opposite side of the housing HS that faces away from one side of the housing HS where the opening OP is defined. The outer circumferential surface of the roller ROL may have a curved surface when viewed in the first direction DR1. A first step portion ST1 may be defined on the outer circumferential surface of the roller ROL.

The roller ROL may include a first roller ROL1 and a second roller ROL2 disposed inside the first roller ROL1. The above-described first step portion ST1 may be defined on the outer circumferential surface of the first roller ROL1. A second step portion ST2 may be defined on the outer circumferential surface of the second roller ROL2. The first step portion ST1 and the second step portion ST2 may be defined in a step shape having a height difference. The first step portion ST1 may be formed by the second step portion ST2, and this configuration will be described below in detail.

The roller ROL may rotate about a rotational axis RX extending in the first direction DR1. The roller ROL may rotate about the rotational axis RX in the clockwise and counterclockwise directions. Although not illustrated, the display device DD may further include an actuator for rotating the roller ROL.

One end of the display module DM may be connected to the roller ROL. The one end of the display module DM may be connected to a side surface of the first step portion ST1. An opposite end of the display module DM that faces away from the one end of the display module DM may be connected to the handle HND. The opposite end of the display module DM may be adjacent to the opening OP.

The display module DM may extend in the second direction DR2 and may be wound around the roller ROL. One portion of the display module DM may be wound around the roller ROL, and another portion of the display module DM may overlap the support part SUP without being wound around the roller ROL.

The display module DM may be inserted into and extracted from the housing HS through the opening OP. One end of the support part SUP may be connected to the handle HND. The support part SUP may be extended in the first direction DR1 like an antenna. This configuration will be described below in detail.

Guide grooves GG may be defined on the support part SUP. The display module DM may be disposed in the guide grooves GG and may move in the second direction DR2 along the guide grooves GG. Substantially, the support part SUP may serve to support the display module DM.

Figure 13:
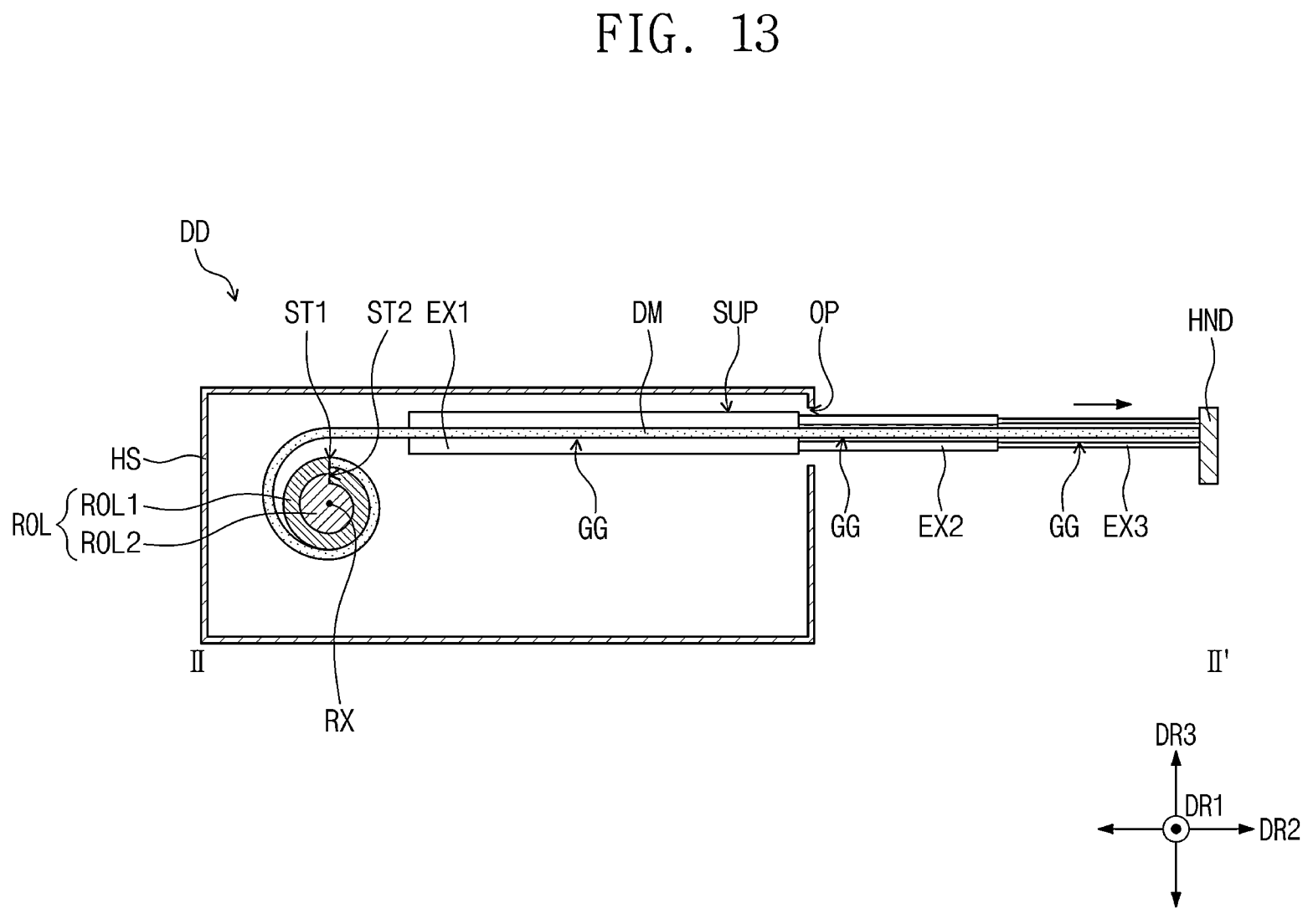
Figure 14:
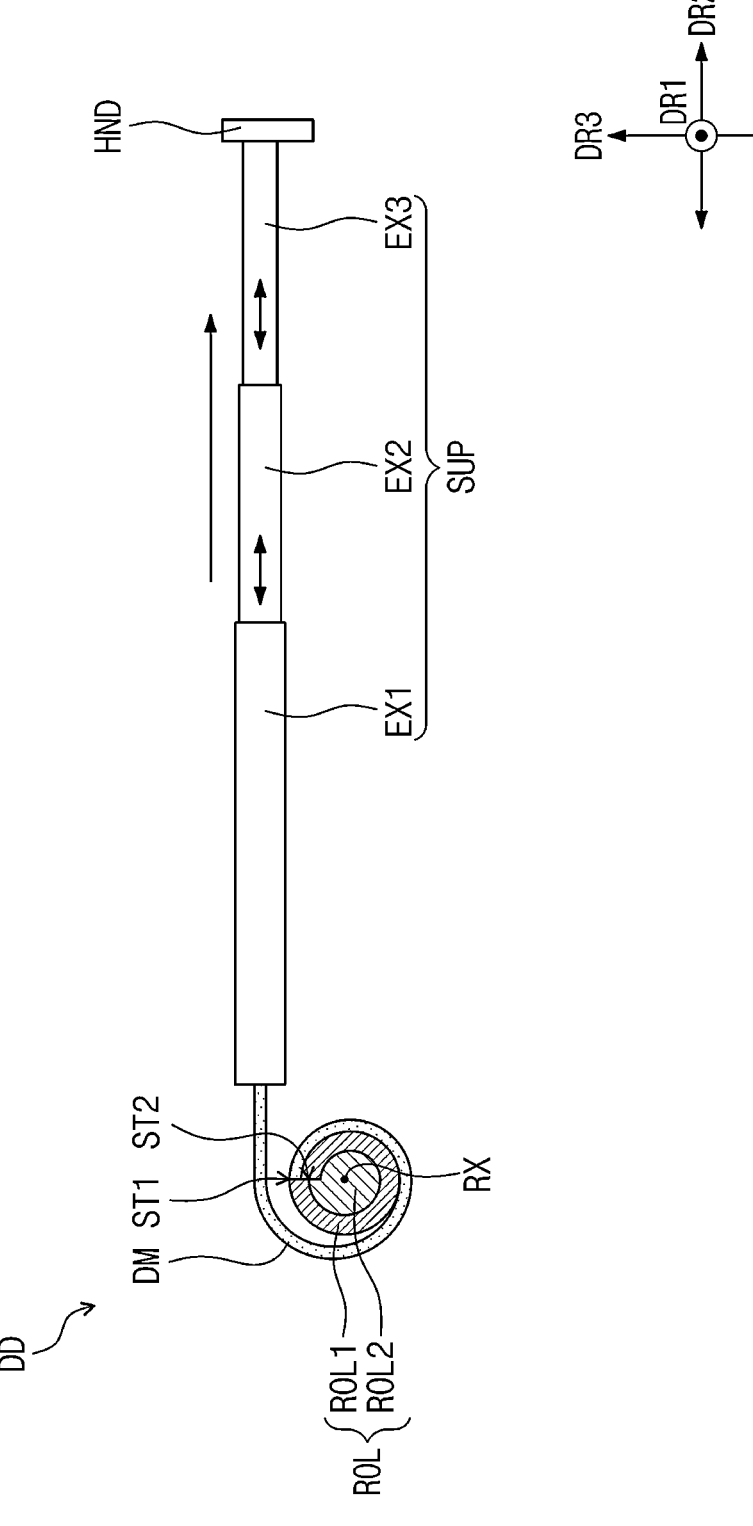
FIG. 14 is a side view illustrating the inside of the housing illustrated in FIG. 2 as viewed in a first direction.

FIG. 13 is a cross-sectional view taken along line II-II' illustrated in FIG. 2. FIG. 14 is a side view illustrating the inside of the housing illustrated in FIG. 2 as viewed in the first direction.

For convenience of description, the housing HS is omitted in FIG. 14.

Referring to FIGS. 13 and 14, the handle HND may move away from the housing HS in the second direction DR2. Depending on the movement of the handle HND, the display module DM connected to the handle HND may move in the second direction DR2.

The display module DM may be unwound from the roller ROL, and the unwound display module DM may be pulled out of the housing HS through the opening OP. Accordingly, the exposed portion of the display module DM may be extended.

When the display module DM is pulled out of the housing HS depending on the movement of the handle HND, the support part SUP connected to the handle HND may be extended outside the housing HS through the opening OP. The support part SUP extended outside the housing HS may support the display module DM outside the housing HS. The display module DM moving outside the housing HS may be supported by the support part SUP.

The support part SUP may include a first extension EX1, a second extension EX2, and a third extension EX3 so as to extend outside the housing HS. The second extension EX2 may be disposed between the first extension EX1 and the third extension EX3.

To implement a structure capable of being extended like an antenna, the second extension EX2 may be inserted into and extracted from the first extension EX1, and the third extension EX3 may be inserted into and extracted from the second extension EX2. The first extension EX1 may be disposed in the housing HS, and the second and third extensions EX2 and EX3 may move outside the housing HS. The third extension EX3 may be connected to the handle HND.

Guide grooves GG may be defined on the first, second, and third extensions EX1, EX2, and EX3. The guide grooves GG defined on the first, second, and third extensions EX1, EX2, and EX3 may be defined as continuous spaces overlapping each other in the first direction DR1. The display module DM may be disposed in the guide grooves GG.

When the handle HND moves toward the housing HS in the second direction DR2, the handle HND may be disposed on the outside of the housing HS so as to be adjacent to the opening OP as illustrated in FIGS. 11 and 12. Depending on the movement of the handle HND, the support part SUP may be retracted in the second direction DR2 and disposed in the housing HS, and the display module DM may be inserted into the housing HS.

Figure 15:
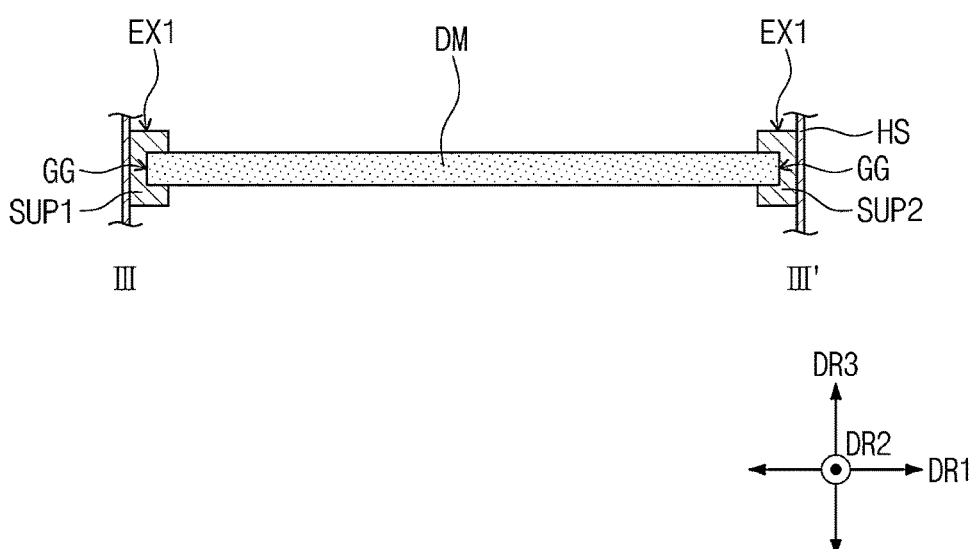
FIG. 15 is a cross-sectional view taken along line III-III' illustrated in FIG. 2.
Figure 16:
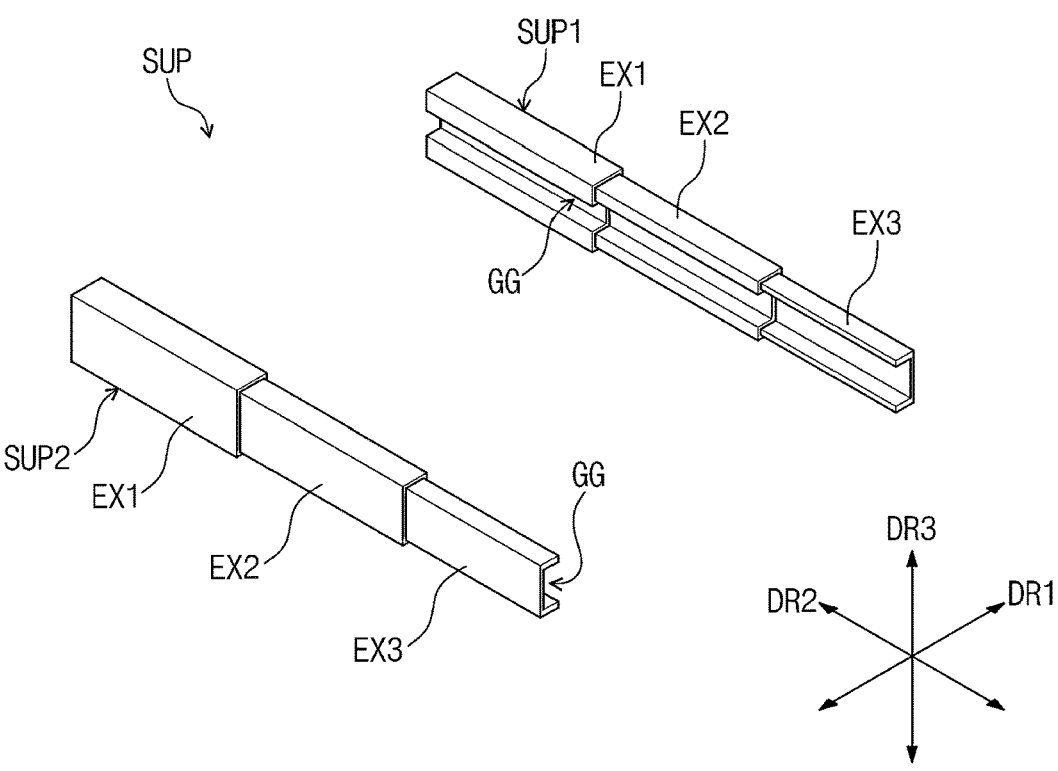
FIG. 16 is a perspective view of a support part illustrated in FIG. 14.

FIG. 15 is a cross-sectional view taken along line III-III' illustrated in FIG. 2. FIG. 16 is a perspective view of the support part illustrated in FIG. 14.

For convenience of description, the display module DM disposed on the first and second support parts SUP1 and SUP2 and portions of the housing HS adjacent to the first and second support parts SUP1 and SUP2 are illustrated in FIG. 15, and other components are omitted.

Referring to FIGS. 15 and 16, the support part SUP may include the first support part SUP1 and the second support part SUP2 that extend in the second direction DR2 and that are spaced apart from each other in the first direction DR1. The first support part SUP1 and the second support part SUP2 may be accommodated in the housing HS.

The display module DM may be disposed between the first support part SUP1 and the second support part SUP2. The first support part SUP1 and the second support part SUP2 may support opposite sides of the display module DM that face away from each other in the first direction DR1.

The opposite sides of the display module DM may be inserted into and disposed in the guide grooves GG defined on an inside surface of the first support part SUP1 and an inside surface of the second support part SUP2 that face each other. The display module DM may move in the second direction DR2 along the guide grooves GG defined on the first and second support parts SUP1 and SUP2.

Each of the first support part SUP1 and the second support part SUP2 may include the first extension EX1, the second extension EX2, and the third extension EX3 that have the guide grooves GG defined thereon. The configuration of the first extension EX1, the second extension EX2, and the third extension EX3 has been described above in detail, and therefore description thereabout will be omitted.

One end of the first support part SUP1 and one end of the second support part SUP2 that are defined as one end of the support part SUP may be connected to the handle HND. Specifically, the third extensions EX3 of the first and second support parts SUP1 and SUP2 may be connected to the handle HND.

The first extensions EX1 may be connected to the housing HS. In an embodiment, the first extensions EX1 may be fixedly connected to inside surfaces of the housing HS that face each other, for example. In the open mode, the first extensions EX1 may be disposed in the housing HS, and the second and third extensions EX2 and EX3 may move outside the housing HS. Accordingly, in the open mode, the first and second support parts SUP1 and SUP2 may be extended outside the housing HS.

Figure 17:
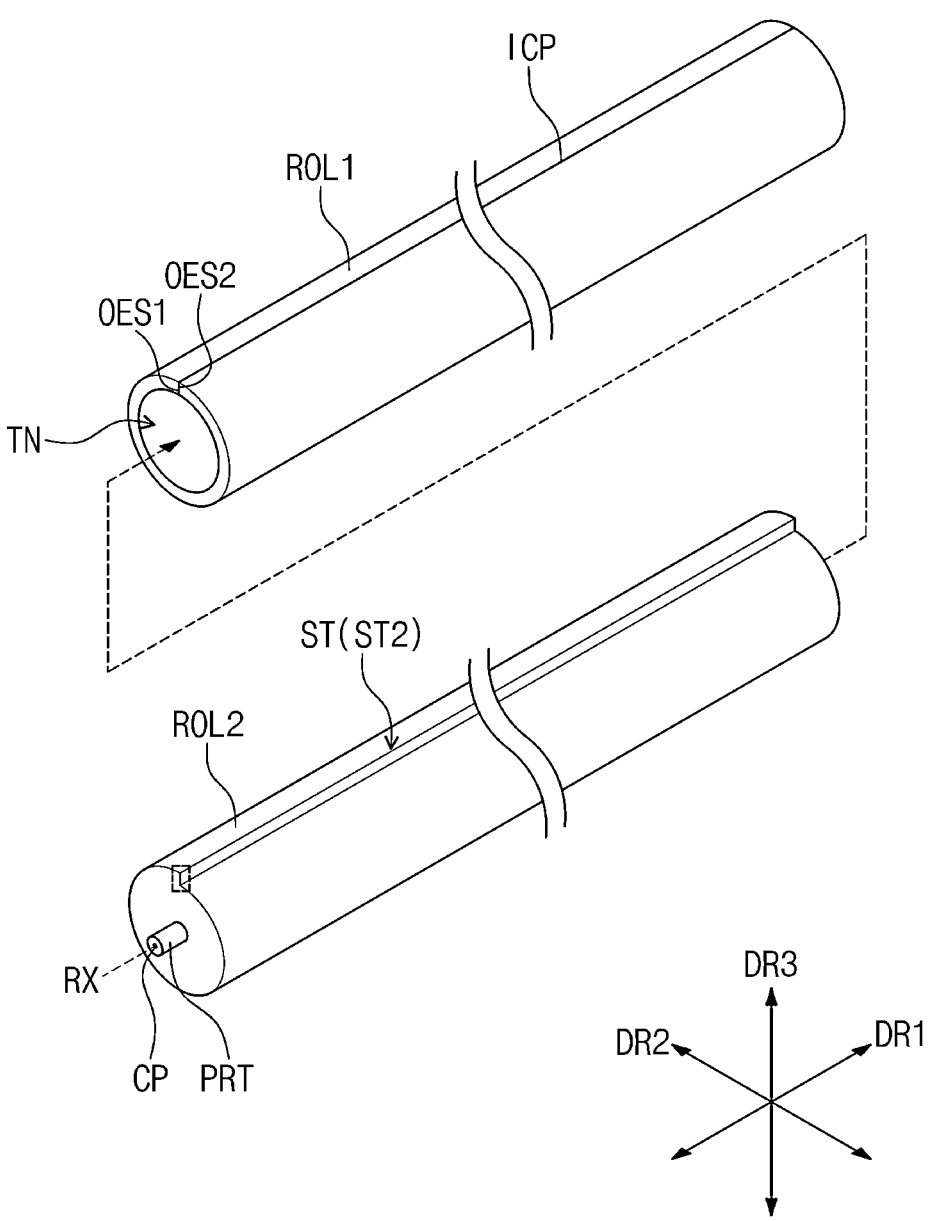
FIG. 17 is an exploded perspective view of a roller illustrated in FIG. 11.

FIG. 17 is an exploded perspective view of the roller illustrated in FIG. 11.

Referring to FIG. 17, the roller ROL may include the first roller ROL1 extending in the first direction DR1 and the second roller ROL2 extending in the first direction DR1. The first roller ROL1 and the second roller ROL2 may include or consist of a metal or plastic.

The first roller ROL1 may have a cylindrical shape extending in the first direction DR1. The first roller ROL1 may have a pipe structure. A cavity TN extending in the first direction DR1 may be defined inside the first roller ROL1, and opposite ends of the first roller ROL1 in the first direction DR1 may be open toward the outside.

The inner circumferential surface of the first roller ROL1 that surrounds the cavity TN may have a curved surface. The outer circumferential surface (e.g., refer to OCS1 in FIG. 18) of the first roller ROL1 that faces away from the inner circumferential surface of the first roller ROL1 and faces toward the outside may have a curved surface. A cut may be made in the first roller ROL1 in the first direction DR1. The cut made in the first roller ROL1 may be defined as an incision ICP. The incision ICP may extend in the first direction DR1. The first roller ROL1 may include one end surface OES1 and an opposite end surface OES2 that face each other at the incision ICP. Depending on this structure, the first roller ROL1, when viewed in the first direction DR1, may have a ring shape with a cut made in a portion.

The second roller ROL2 may have a cylindrical shape extending in the first direction DR1. The outer circumferential surface (e.g., refer to OCS2 of FIG. 18) of the second roller ROL2 may have a curved surface. The second roller ROL2 may have a step portion ST. The step portion ST may be the above-described second step portion ST2. A portion of the outer circumferential surface of the second roller ROL2 may protrude outward to form the step portion ST of the second roller ROL2. When viewed in the first direction DR1, the step portion ST may have a step shape (a portion illustrated by a dotted line) on the outer circumferential surface of the second roller ROL2.

A plurality of protrusions PRT may be disposed at opposite ends of the second roller ROL2 that face away from each other in the first direction DR1. The protrusions PRT may protrude outward from the opposite ends of the second roller ROL2. The protrusions PRT may be connected to the above-described inside surfaces of the housing HS. The protrusions PRT may have a cylindrical shape extending in the first direction DR1 so as to be rotatably coupled to the housing HS.

The rotational axis RX extending in the first direction DR1 may be defined in the second roller ROL2. The rotational axis RX may pass through the centers of the protrusions PRT. Center points CP may be defined at the centers of the protrusions PRT by the rotational axis RX. The center points CP may also be defined as the center points of the second roller ROL2. The second roller ROL2 may rotate about the rotational axis RX in the clockwise or counterclockwise direction.

The second roller ROL2 may be inserted into the cavity TN defined in the first roller ROL1. When the second roller ROL2 is disposed in the cavity TN of the first roller ROL1, the first step portion ST1 of the first roller ROL1 illustrated in FIG. 11 may be formed. This configuration will be described below in more detail with reference to FIG. 19.

Figures 18, 19:
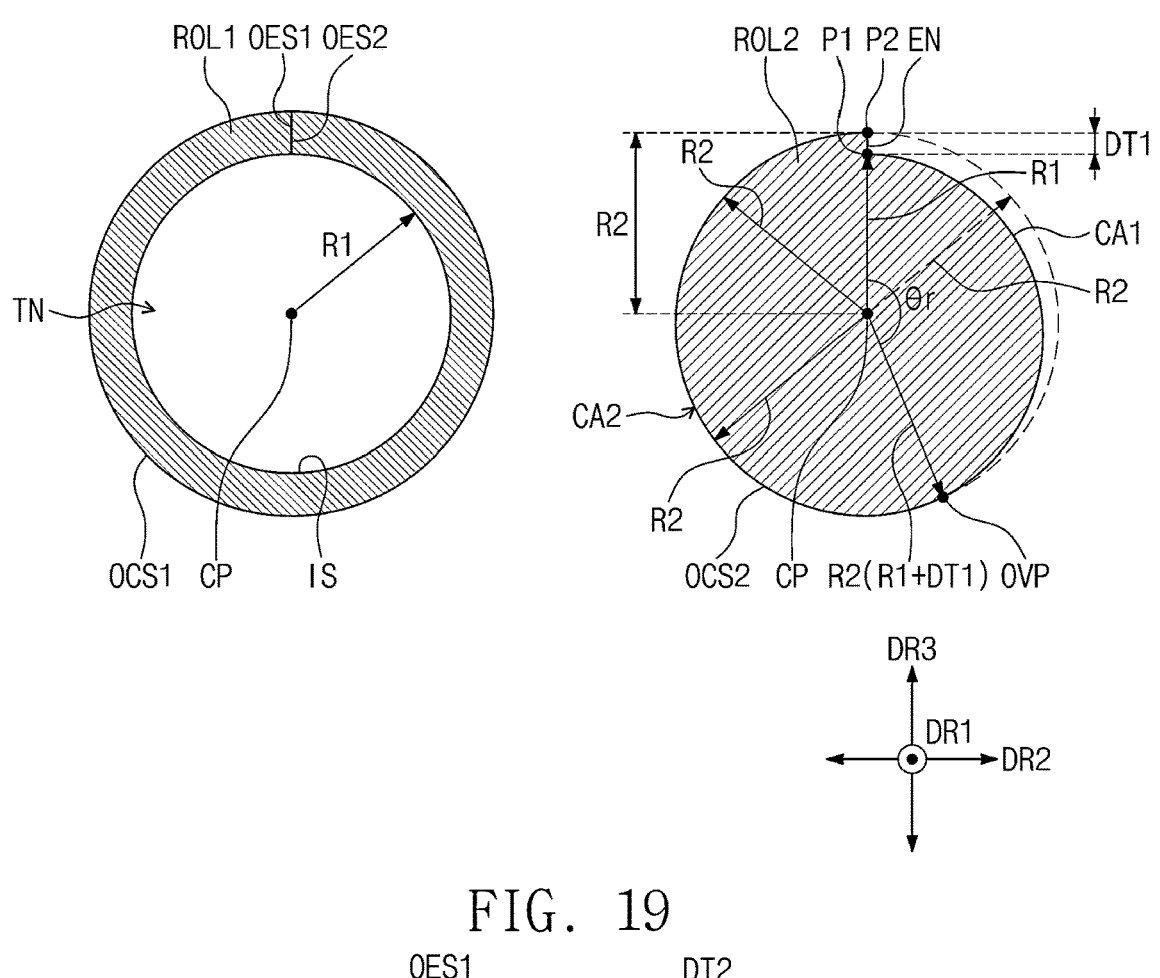
FIG. 18 is an enlarged view illustrating cross-sections of a first roller and a second roller illustrated in FIG. 17.
FIG. 19 is a view illustrating a configuration in which the second roller illustrated in FIG. 18 is inserted into a cavity of the first roller.

FIG. 18 is an enlarged view illustrating cross-sections of the first roller and the second roller illustrated in FIG. 17.

In FIG. 18, the cross-sections of the first roller ROL1 and the second roller ROL2 viewed in the first direction DR1 are illustrated.

Referring to FIGS. 17 and 18, when the first step portion ST1 is not formed on the first roller ROL1, the one end surface OES1 and the opposite end surface OES2 may cover an entirety of each other. In an embodiment, an upper end of the one end surface OES1 and an upper end of the opposite end surface OES2 may overlap each other, for example. In addition, a lower end of the one end surface OES1 and a lower end of the opposite end surface OES2 may overlap each other.

When the first step portion ST1 is not formed on the first roller ROL1, a center point CP may be defined in the cavity TN of the first roller ROL1. The center point CP may be the center point CP of the second roller ROL2 when the second roller ROL2 is disposed in the first roller ROL1. The center point CP of the first roller ROL1 and the center point CP of the second roller ROL2 may correspond to the above-described rotational axis RX. The center point CP of the first roller ROL1 and the center point CP of the second roller ROL2 may be points through which the above-described rotational axis RX passes. When viewed in the first direction DR1, the inner circumferential surface IS of the first roller ROL1 may have a circular shape with a first radius R1 with respect to the center point CP.

The second roller ROL2 may include a first circular arc CAL and a second circular arc CA2. The outer circumferential surface of the second roller ROL2 may include the first circular arc CAL and the second circular arc CA2. The step portion ST may be defined by the first circular arc CAL and the second circular arc CA2.

The first circular arc CAL may be defined as a curve from 0 degree to a reference angle $\theta r$ with respect to the center point CP. The second circular arc CA2 may extend from the first circular arc CAL and may be defined as a curve from the reference angle $\theta r$ to 360 degrees with respect to the center point CP. In FIG. 18, 0 degree and 360 degrees may be defined based on an upper direction of the third direction DR3. The reference angle $\theta r$ may be set to one of angles greater than 90 degrees and less than 360 degrees.

A point of the first circular arc CAL that corresponds to 0 degree may be defined as a first point P1. A point of the second circular arc CA2 that corresponds to 360 degrees may be defined as a second point P2. A point corresponding to the reference angle $\theta r$ may be defined as an overlapping point OVP.

The first circular arc CAL and the second circular arc CA2 may overlap each other at the overlapping point OVP corresponding to the reference angle $\theta r$. When viewed in the third direction DR3, the first circular arc CAL and the second circular arc CA2 may overlap each other at the first point P1 and the second point P2.

The start point of the first circular arc CAL may be defined as the first point P1, and the end point of the first circular arc CAL may be defined as the overlapping point OVP. The start point of the second circular arc CA2 may be defined as the overlapping point OVP, and the end point of the second circular arc CA2 may be defined as the second point P2.

On the first circular arc CA1, the first point P1 may have a first radius R1 with respect to the center point CP. The first circular arc CAL may have a variable radius with respect to the center point CP. In an embodiment, the radius of the first circular arc CAL with respect to the center point CP may be gradually increased from the first radius R1 to a second radius R2 greater than the first radius R1 with an approach to the reference angle θr from the 0 degree, for example. Because the radius is variable, the first circular arc CA1 may have a variable curvature.

The second circular arc CA2 may have a constant radius with respect to the center point CP. In an embodiment, the second circular arc CA2 may have the second radius R2 with respect to the center point CP from the reference angle θr to 360 degrees, for example. Because the radius is constant, the second circular arc CA2 may have a constant curvature.

The first circular arc CAL and the second circular arc CA2 of FIG. 18 are defined in the clockwise direction from 0 degree. However, embodiments of the disclosure are not limited thereto. In an embodiment, the outer circumferential surface of the second roller ROL2 may be divided based on the counterclockwise direction, for example. Specifically, based on the counterclockwise direction, the outer circumferential surface of the second roller ROL2 may be divided into a first circular arc and a second circular arc with respect to the overlapping point OVP. Depending on the criteria for division, the first circular arc may correspond to the second circular arc CA2 illustrated in FIG. 18, and the second circular arc may correspond to the first circular arc CAL illustrated in FIG. 18. Accordingly, based on the counterclockwise direction, the radius of the first circular arc may be constant, and the radius of the second circular arc may be variable (e.g., decreased).

The distance between the first point P1 and the second point P2 may be defined as a first distance DT1. The second radius R2 may be set to a value obtained by adding the first distance DT1 and the first radius R1.

The first point P1 and the second point P2 may be spaced apart from each other, and the second point P2 may be disposed outward of the first point P1 and may be connected to the first point P1. A portion connecting the first point P1 and the second point P2 may be defined as an end portion EN of the second roller ROL2. The end portion EN may define a height difference of the step portion ST. That is, the first distance DT1 may define the height difference of the step portion ST. Accordingly, the end portion EN, a portion of the first circular arc CAL adjacent to the end portion EN, and a portion of the second circular arc CA2 adjacent to the end portion EN may define the step portion ST.

The end portion EN may vertically extend. In an embodiment, a tangent line at the first point P1 and a tangent line at the second point P2 may be parallel to each other, and the end portion EN may extend in a direction perpendicular to the tangent lines at the first and second points P1 and P2, for example. The extension direction of the end portion EN in FIG. 18 may be the third direction DR3.

A curve illustrated by a dotted line in FIG. 18, together with the second circular arc CA2, may form a circle having the second radius R2. Substantially, the first circular arc CAL may be formed by processing the portion corresponding to the dotted line.

FIG. 19 is a view illustrating a configuration in which the second roller illustrated in FIG. 18 is inserted into the cavity of the first roller.

Referring to FIGS. 18 and 19, the second roller ROL2 may be disposed in the cavity TN and may be inserted into the first roller ROL1 accordingly. When the second roller ROL2 is disposed in the cavity TN, the step portion ST of the second roller ROL2 may be adjacent to the boundary between the one end surface OES1 and the opposite end surface OES2 of the first roller ROL1.

The end portion EN may overlap the boundary between the one end surface OES1 and the opposite end surface OES2. Accordingly, the second point P2 may overlap the boundary between the one end surface OES1 and the opposite end surface OES2. In this case, the end portion EN may face the opposite end surface OES2. The end portion EN may face a lower portion of the opposite end surface OES2 and may contact the lower portion of the opposite end surface OES2.

The portion of the first circular arc CAL adjacent to the end portion EN may be disposed below the opposite end surface OES2, and the portion of the second circular arc CA2 adjacent to the end portion EN may be disposed below the one end surface OES1. The step portion ST may cause the upper end of the one end surface OES1 to protrude outward beyond the upper end of the opposite end surface OES2. In an embodiment, the portion of the second circular arc CA2 adjacent to the end portion EN may move the one end surface OES1 upward. Accordingly, the upper portion of the one end surface OES1 may be exposed to the outside without facing the opposite end surface OES2, for example.

The step portion ST may push the upper end of the one end surface OES1 outward of the upper end of the opposite end surface OES2 to form the first step portion ST1 on the first roller ROL1. The height difference of the first step portion ST1 may be defined by the portion of the one end surface OES1 disposed above the opposite end surface OES2. Accordingly, the step portion ST of the second roller ROL2 may cause the step between the one end surface OES1 and the opposite end surface OES2.

The display module DM may be connected to the incision of the first roller ROL1. The first step portion ST1 may be defined at the incision of the first roller ROL1 by the step portion ST, and the display module DM may be connected to the first step portion ST1. In an embodiment, one side surface of the display module DM may face a partial surface of the one end surface OES1 disposed above the opposite end surface OES2 and may be connected to the partial surface of the one end surface OES1 disposed above the opposite end surface OES2, for example. However, the disclosure is not limited thereto, and a lower portion of the one side surface of the display module DM may be connected to an upper portion of the opposite end surface OES2. The partial surface of the one end surface OES1 disposed above the opposite end surface OES2 may be defined as a side surface of the first step portion ST1.

The distance between the upper end of the one end surface OES1 and the upper end of the opposite end surface OES2 may be defined as a second distance DT2. The second distance DT2 may be diversely adjusted depending on the thickness of the display module DM. This configuration will be described below in detail.

When the end portion EN (or the second point P2) overlaps the boundary between the one end surface OES1 and the opposite end surface OES2, the first distance DT1 may be equal to the second distance DT2. The second distance DT2 may correspond to the thickness of the display module DM. In an embodiment, a difference between the second distance DT2 and the thickness of the display module DM (a difference expressed as an absolute value) may be set to 5% or less of the second distance DT2. Ideally, the thickness of the display module DM may be equal to the second distance DT2, for example.

Figure 20:
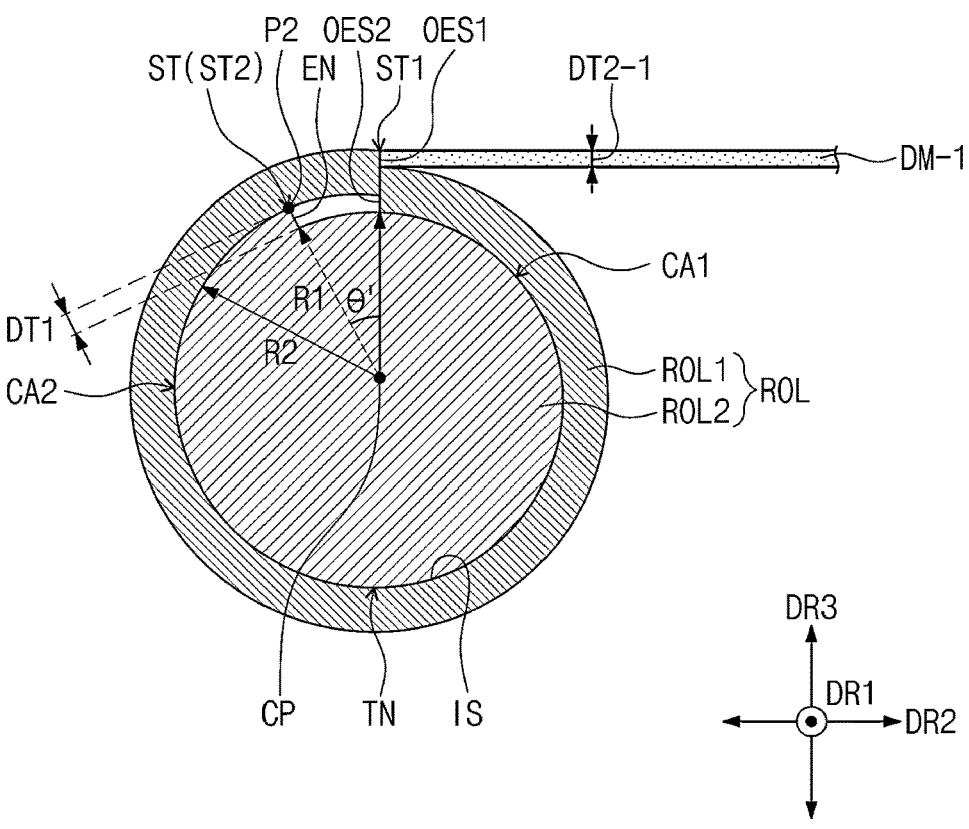
FIGS. 20 and 21 are views illustrating configurations in which the second roller is disposed at positions different from that illustrated in FIG. 19.
Figure 21:
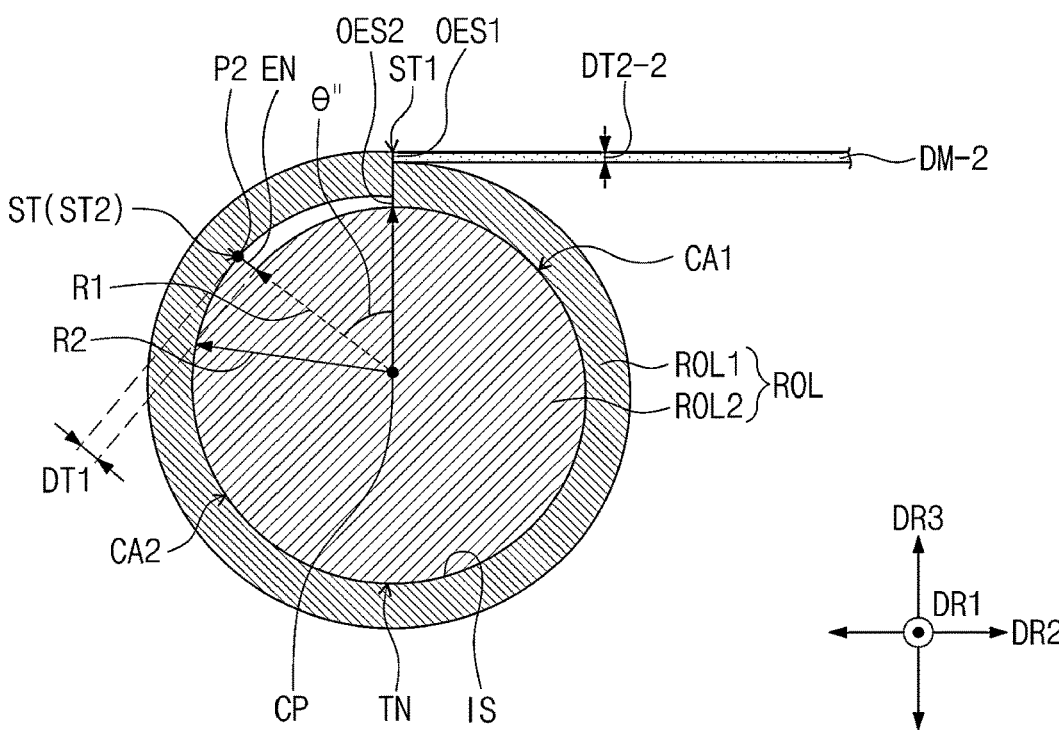

FIGS. 20 and 21 are views illustrating configurations in which the second roller is disposed at positions different from that illustrated in FIG. 19.

The following description will be focused on differences between the components illustrated in FIG. 19 and the components illustrated in FIGS. 20 and 21.

Referring to FIG. 20, display modules having various thicknesses may be used in various display devices. In an embodiment, a display module DM-1 may have a thickness less than that of the display module DM illustrated in FIG. 19, for example.

The end portion EN of the second roller ROL2 may be disposed on the inner circumferential surface of the first roller ROL1 adjacent to the one end surface OES1 so as to be spaced apart from the one end surface OES1. In an embodiment, the second point P2 may be disposed on the inner circumferential surface of the first roller ROL1 so as to be spaced apart from the one end surface OES1, for example. The second roller ROL2 may rotate by a first angle $\theta'$ in the counterclockwise direction, and the end portion EN may be spaced apart from the one end surface OES1. Accordingly, a space may be defined between the end portion EN and the opposite end surface OES2.

Depending on the restoring force of the first roller ROL1, the one end surface OES1 may move inward with respect to the position illustrated in FIG. 19. Accordingly, the distance between the upper end of the one end surface OES1 and the upper end of the opposite end surface OES2 may be less than that in FIG. 19.

The first distance DT1 may be greater than a second distance DT2-1 defined as the distance between the upper end of the one end surface OES1 and the upper end of the opposite end surface OES2. The thickness of the display module DM-1 may correspond to the second distance DT2-1. As described above, a difference between the second distance DT2-1 and the thickness of the display module DM-1 (a difference expressed as an absolute value) may be set to 5% or less of the second distance DT2-1. Ideally, the thickness of the display module DM-1 may be equal to the second distance DT2-1. When the display module DM-1 thinner than the display module DM is used, the second distance DT2-1 may be set to a value corresponding to the thickness of the display module DM-1 by adjusting the position of the step portion ST.

Referring to FIG. 21, a display module DM-2 may have a thickness less than that of the display module DM-1 illustrated in FIG. 20.

The end portion EN of the second roller ROL2 may be disposed on the inner circumferential surface of the first roller ROL1 adjacent to the one end surface OES1 so as to be spaced apart from the one end surface OES1. The second roller ROL2 may rotate by a second angle $\theta''$ greater than the first angle $\theta'$ in the counterclockwise direction, and the end portion EN may be spaced apart from the one end surface OES1. A space may be defined between the end portion EN and the opposite end surface OES2.

Depending on the restoring force of the first roller ROL1, the one end surface OES1 may move inward with respect to the position illustrated in FIG. 20. Accordingly, the distance between the upper end of the one end surface OES1 and the upper end of the opposite end surface OES2 may be less than that in FIG. 20.

The first distance DT1 may be greater than a second distance DT2-2 defined as the distance between the upper end of the one end surface OES1 and the upper end of the opposite end surface OES2. The thickness of the display module DM-2 may correspond to the second distance DT2-2. As described above, a difference between the second distance DT2-2 and the thickness of the display module DM-2 (a difference expressed as an absolute value) may be set to 5% or less of the second distance DT2-2. Ideally, the thickness of the display module DM-2 may be equal to the second distance DT2-2. That is, when the display module DM-2 thinner than the display module DM-1 is used, the second distance DT2-2 may be set to a value corresponding to the thickness of the display module DM-2 by adjusting the position of the step portion ST. Referring to FIGS. 19, 20, and 21, the step between the one end surface OES1 and the opposite end surface OES2 may be adjusted depending on the rotary motion of the second roller ROL2. Accordingly, the second roller ROL2 may be defined as a step adjustment part.

The second distance may be gradually decreased as the end portion EN moves away from the one end surface OES1. In an embodiment, the second distance may be gradually decreased as the second point P2 moves away from the one end surface OES1, for example. Accordingly, in an embodiment of the disclosure, the second distance may be adjusted in various ways such that the first step portion ST1 is formed in various sizes. Thus, when the display modules DM, DM-1, and DM-2 having various thicknesses are used, each of the display modules DM, DM-1, and DM-2 may be easily connected to the roller ROL by adjusting the position of the second roller ROL2. Each of the display modules DM, DM-1, and DM-2 may be connected to the first roller ROL1 and may be wound around the outer circumferential surface of the first roller ROL1.

When the display modules DM, DM-1, and DM-2 having various thicknesses are used, a plurality of rollers having step portions corresponding to the display modules DM, DM-1, and DM-2 have to be separately manufactured. However, in an embodiment of the disclosure, each of the display modules DM, DM-1, and DM-2 having various thicknesses may be easily connected to the roller ROL by adjusting the position of the second roller ROL2. Accordingly, it is not desired to separately manufacture rollers having various step portions.

Figure 22:
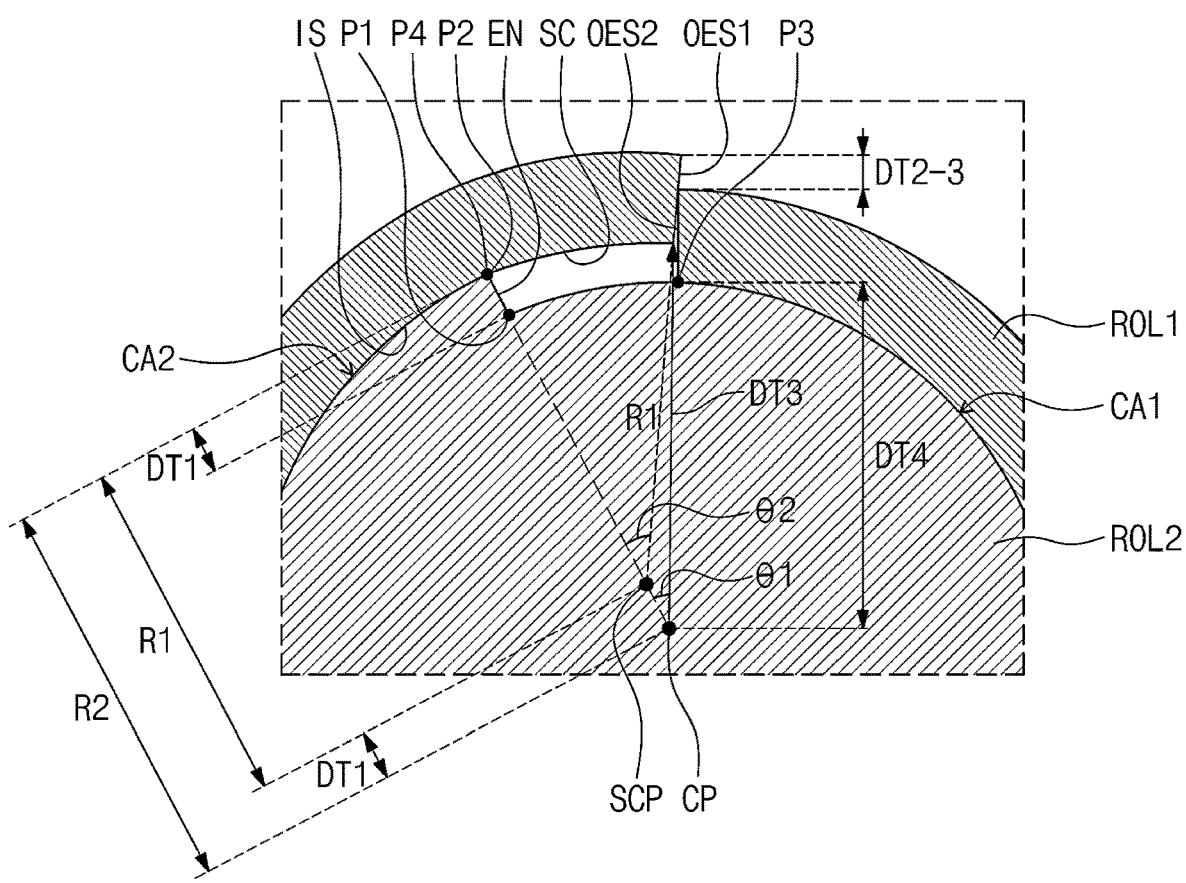
FIGS. 22 and 23 are views for explaining a method of calculating a second distance when an end portion of the second roller is spaced apart from one end surface of the first roller as illustrated in FIGS. 20 and 21.
Figure 23:
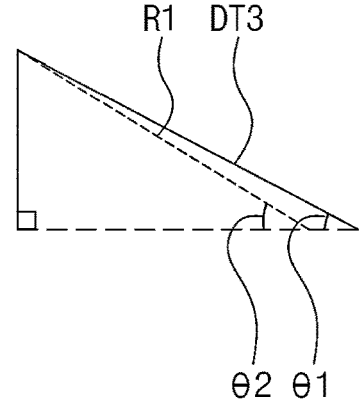

FIGS. 22 and 23 are views for explaining a method of calculating the second distance when the end portion of the second roller is spaced apart from the one end surface of the first roller as illustrated in FIGS. 20 and 21.

Referring to FIG. 22, when the end portion EN of the second roller ROL2 is spaced apart from the one end surface OES1 of the first roller ROL1 and a space is defined between the end portion EN and the opposite end surface OES2, the one end surface OES1 may move inward.

A point of the first circular arc CAL overlapping the lower end of the opposite end surface OES2 may be defined as a third point P3. A point on the inner circumferential surface IS of the first roller ROL1 that overlaps the second point P2, which is the upper end of the end portion EN, may be defined as a fourth point P4. The fourth point P4 may be defined as an inner point. The inner circumferential surface IS of the first roller ROL1 from the lower end of the one end surface OES1 to the fourth point P4 may be defined as a sub-curved surface SC.

Depending on the restoring force of the first roller ROL1, the curvature of the sub-curved surface SC may return to that of the first roller ROL1 illustrated in FIG. 18. Accordingly, the curvature of the sub-curved surface SC may be substantially the same as the curvature of the inner circumferential surface IS of the first roller ROL1 in the state of the first roller ROL1 illustrated in FIG. 18. Accordingly, the sub-curved surface SC may have the first radius R1 with respect to a sub-center point SCP. The sub-center point SCP may be defined as a point having the first radius R1 with respect to the sub-curved surface SC.

The sub-center point SCP may be spaced apart from the center point CP and may be disposed on a radius line that connects the center point CP and the first point P1. The distance between the sub-center point SCP and the center point CP may be the first distance DT1.

The angle defined by the fourth point P4 and the lower end of the one end surface OES1 with respect to the center point CP may be defined as a first angle θ1. The angle defined by the fourth point P4 and the lower end of the one end surface OES1 with respect to the sub-center point SCP may be defined as a second angle θ2.

The second distance DT2-3 may correspond to a value obtained by subtracting the fourth distance DT4 between the center point CP and the third point P3 from the third distance DT3 between the center point CP and the lower end of the one end surface OES1. That is, the second distance DT2-3 may be substantially the same as the value obtained by subtracting the fourth distance DT4 from the third distance DT3. Accordingly, the second distance DT2-3 may be expressed by Equation 1 below.

$$DT2 - 3(\theta 1) = DT3 - DT4 \qquad \text{[Equation 1]}$$

In Equation 1, DT2-3 (θ1) may represent the second distance DT2-3 when the end portion EN (or the second point P2) moves by the first angle θ1. The third distance DT3 may be defined as an inner distance.

Referring to FIG. 23, Equation 2 and Equation 3 below may be obtained using trigonometric functions for the third distance DT3, the first radius R1, the first distance DT1, the first angle θ1, and the second angle θ2.

$$R1\sin\theta 2 = DT3\sin\theta 1 \qquad \text{[Equation 2]}$$

$$R1\cos\theta 2 = DT3\cos\theta 1 - DT1 \qquad \text{[Equation 3]}$$

Equation 4 below may be obtained by adding the square of Equation 2 and the square of Equation 3. The third distance DT3 for the first angle θ1 may be determined by Equation 4 below.

$$DT3(\theta 1) = \sqrt{(R1^2 - DT1^2\sin^2\theta 1)} + DT1\cos\theta 1 \qquad \text{[Equation 4]}$$

In Equation 4, DT3 may denote the third distance DT3, θ1 may denote the first angle θ1, DT3(θ1) may denote the third distance DT3 for the first angle θ1, R1 may denote the first radius R1, and DT1 may denote the first distance DT1.

Figure 24:
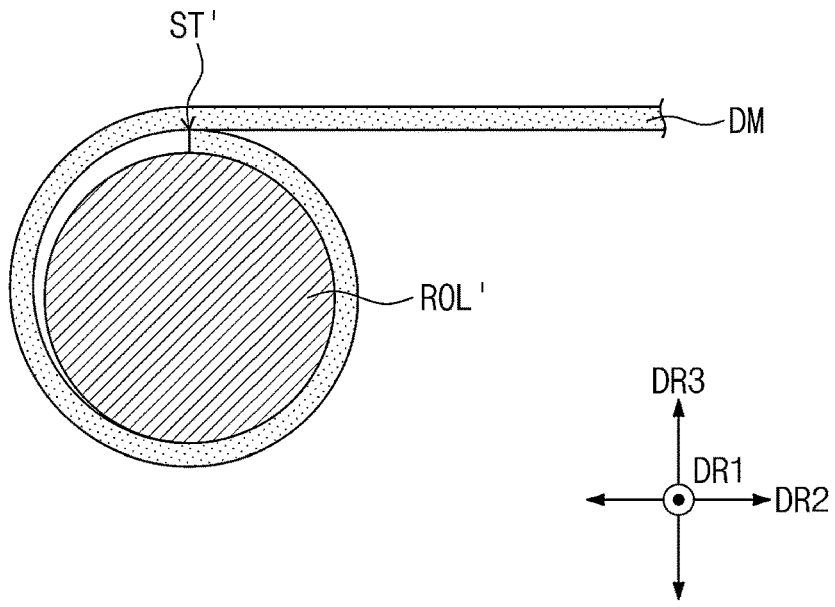
FIG. 24 is a view illustrating a display module connected to a single roller.

FIG. 24 is a view illustrating a display module connected to a single roller.

Referring to FIG. 24, when the display module DM is connected to the outer circumferential surface of the roller ROL', one end of the display module DM may be disposed on the outer circumferential surface of the roller ROL' with a step. The one end of the display module DM disposed on the outer circumferential surface of the roller ROL' with the step may be defined as a step portion ST'. In this case, when the display module DM is wound around the roller ROL', the display module DM disposed on the step portion ST' may be damaged by the step portion ST'.

However, referring to FIG. 11, in an embodiment of the disclosure, the display module DM may be adjacent to the side surface of the first step portion ST1 of the roller ROL. In this case, the display module DM may not be disposed on the outer circumferential surface of the roller ROL with a step. Accordingly, unlike in FIG. 24, damage to the display module DM may be prevented.

Figure 25:
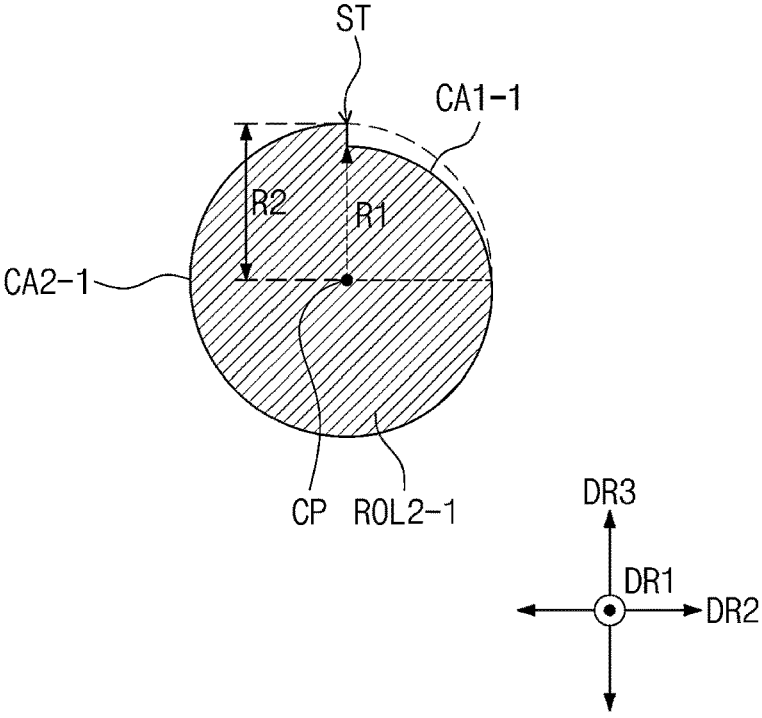
FIGS. 25 to 27 are views illustrating an embodiment of various processed states of second rollers according to the disclosure.
Figure 26:
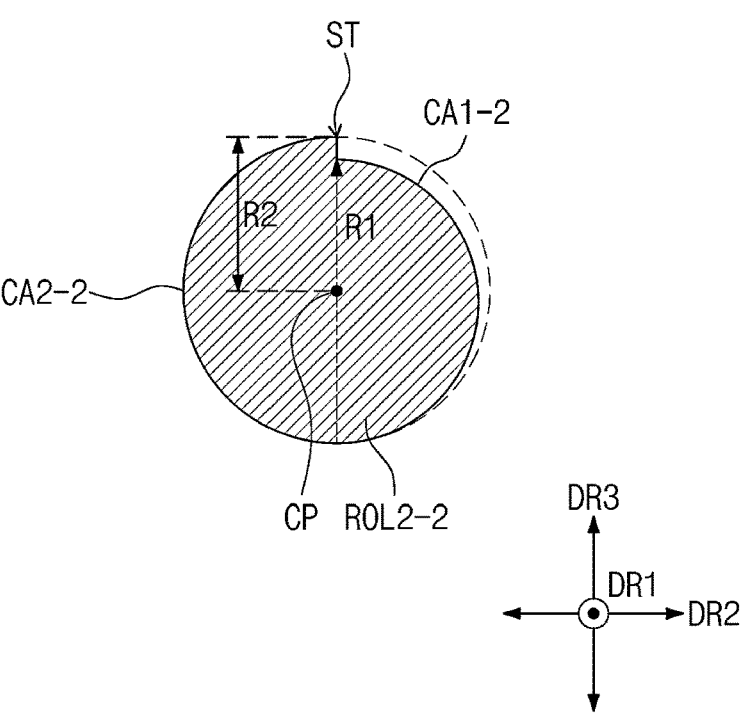
Figure 27:
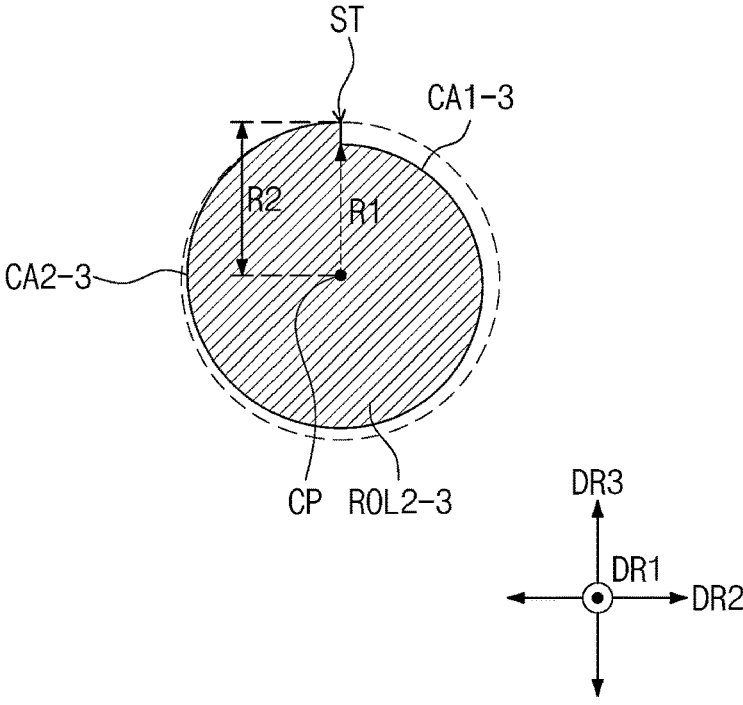

FIGS. 25 to 27 are views illustrating an embodiment of various processed states of second rollers according to the disclosure.

Referring to FIG. 25, a second roller ROL2-1 may include a first circular arc CA1-1 and a second circular arc CA2-1. The first circular arc CA1-1 may be formed from 0 degree to 90 degrees with respect to a center point CP. The first circular arc CA1-1 may be formed by processing a portion illustrated by a dotted line.

Referring to FIG. 26, a second roller ROL2-2 may include a first circular arc CA1-2 and a second circular arc CA2-2. The first circular arc CA1-2 may be formed from 0 degree to 180 degrees with respect to a center point CP. The first circular arc CA1-2 may be formed by processing a portion illustrated by a dotted line.

Referring to FIG. 27, a second roller ROL2-3 may include a first circular arc CA1-3 and a second circular arc CA2-3. The first circular arc CA1-3 may be formed from 0 degree to 360 degrees with respect to a center point CP. The first circular arc CA1-3 may be formed by processing a portion illustrated by a dotted line. When the first circular arc CA1-3 is formed up to 360 degrees, the second circular arc CA2-3 may be omitted.

Referring to FIGS. 25 and 27, step portions ST may be formed on the processed second rollers ROL2-1, ROL2-2, and ROL2-3.

Figure 28:
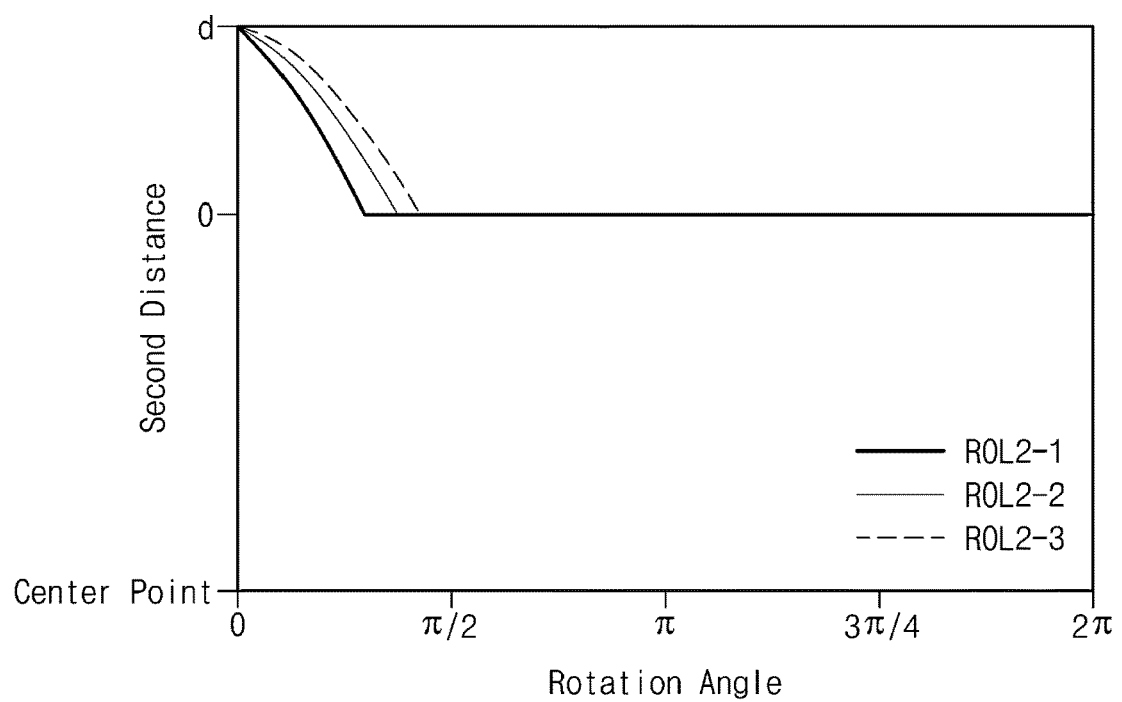
FIG. 28 is a graph depicting a change in the second distance depending on rotation of the second rollers when the second rollers illustrated in FIGS. 25 to 27 are used.
Figure 29:
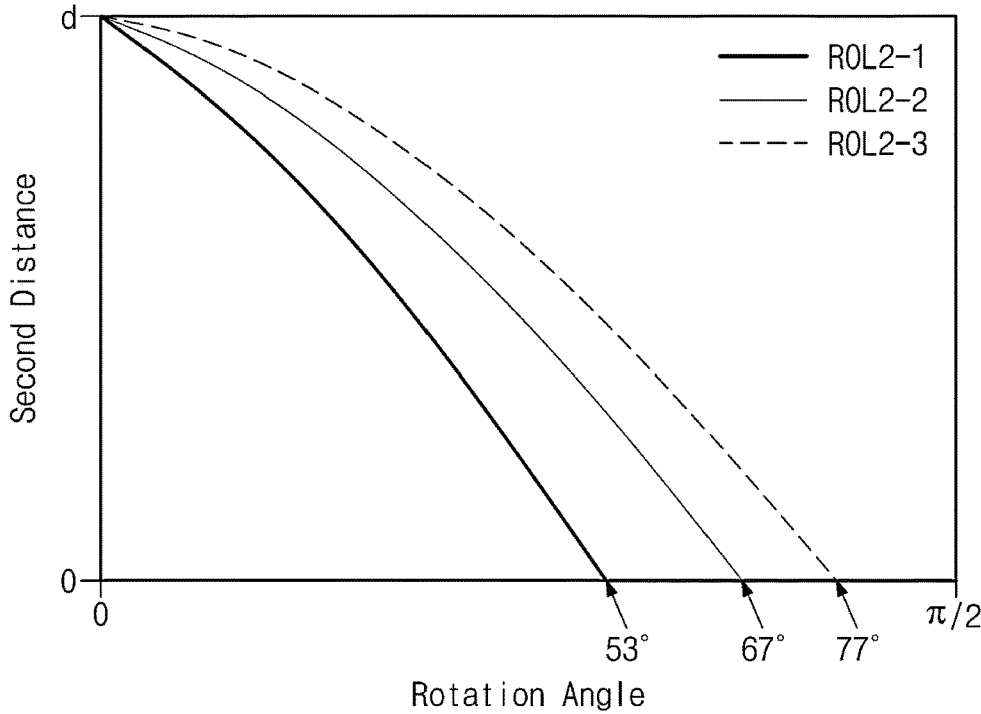
FIG. 29 is an enlarged view of a portion of the graph illustrated in FIG. 28.

FIG. 28 is a graph depicting a change in the second distance depending on rotation of the second rollers when the second rollers illustrated in FIGS. 25 to 27 are used. FIG. 29 is an enlarged view of a portion of the graph illustrated in FIG. 28.

In FIGS. 28 and 29, the vertical axis represents the above-described second distance, and the horizontal axis represents the rotation angles of the second rollers ROL2-1, ROL2-2, and ROL2-3 in the counterclockwise direction. In addition, "d" represents the second distance when the second rollers ROL2-1, ROL2-2, and ROL2-3 overlap the boundary between the one end surface OES1 and the opposite end surface OES2 as illustrated in FIG. 19. "d" may be the maximum value of the second distance.

Referring to FIGS. 28 and 29, when the step portions ST of the second rollers ROL2-1, ROL2-2, and ROL2-3 overlap the boundary between the one end surface OES1 and the opposite end surface OES2, the second distance may be maximized. The second distance may be gradually decreased as each of the second rollers ROL2-1, ROL2-2, and ROL2-3 rotates in the first roller ROL1 in the counterclockwise direction such that the step portion ST moves away from the one end surface OES1.

As the step portions ST move away from the one end surface OES1 in the counterclockwise direction, the second distance may be gradually decreased and then may become zero. When the second distance is zero, the points at which the step portions ST are disposed may be defined as limit points. In an embodiment, the points at which the end portions EN are disposed may be defined as the limit points, for example. The angles of the limit points may be defined as angles of the points at which the end portions EN are disposed with respect to 0 degree.

When the second distance is zero, the upper end of the one end surface OES1 and the upper end of the opposite end surface OES2 illustrated in FIG. 19 may overlap each other. 53°, 67°, and 77° illustrated in FIG. 29 may represent angles of the limit points for the second rollers ROL2-1, ROL2-2, and ROL2-3.

In FIGS. 25 to 27, the processing angle of the second roller ROL2-3 may be greater than the processing angle of the second roller ROL2-2, and the processing angle of the second roller ROL2-2 may be greater than the processing angle of the second roller ROL2-1. The angles of the limit points may be increased as the processing angles of the second rollers ROL2-1, ROL2-2, and ROL2-3 are increased.

Figure 30:
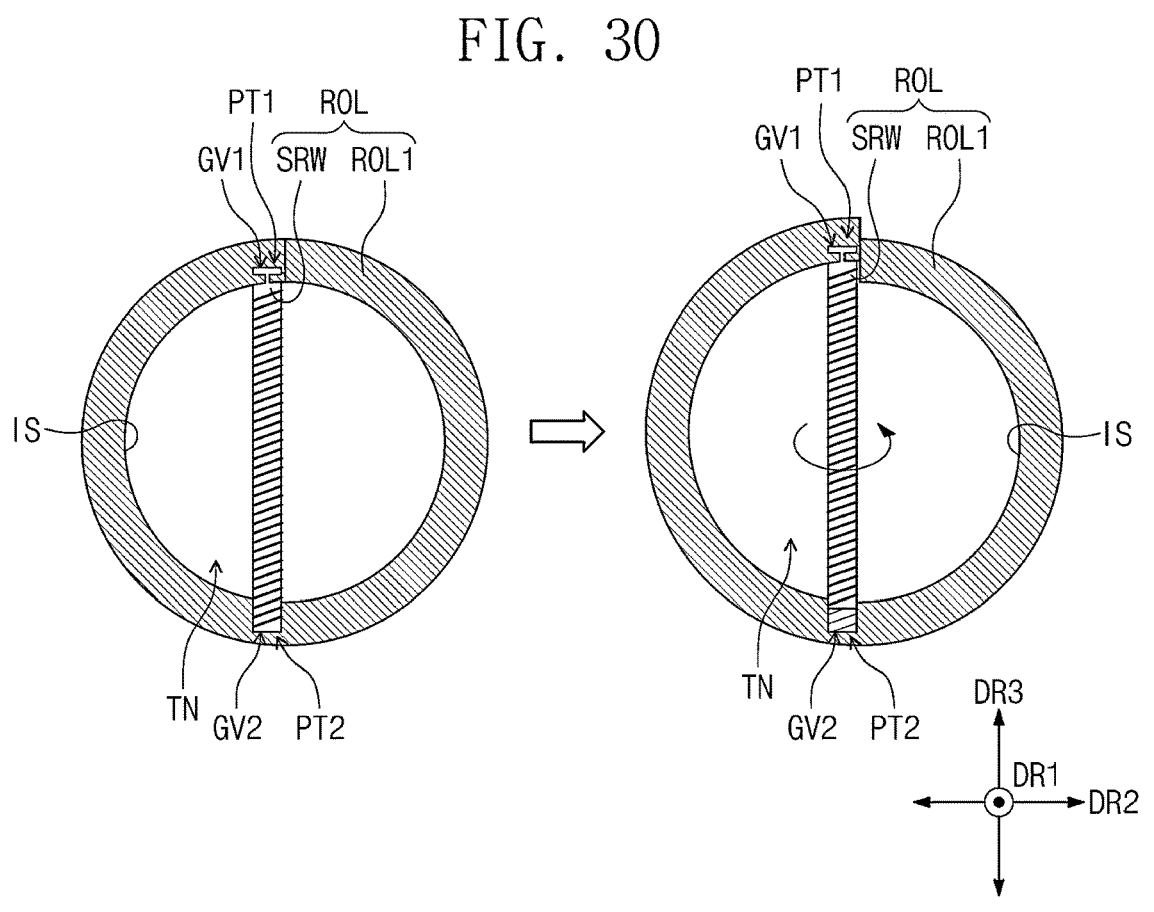
FIGS. 30 and 31 are views illustrating an embodiment of components of a roller according to the disclosure.
Figure 31:
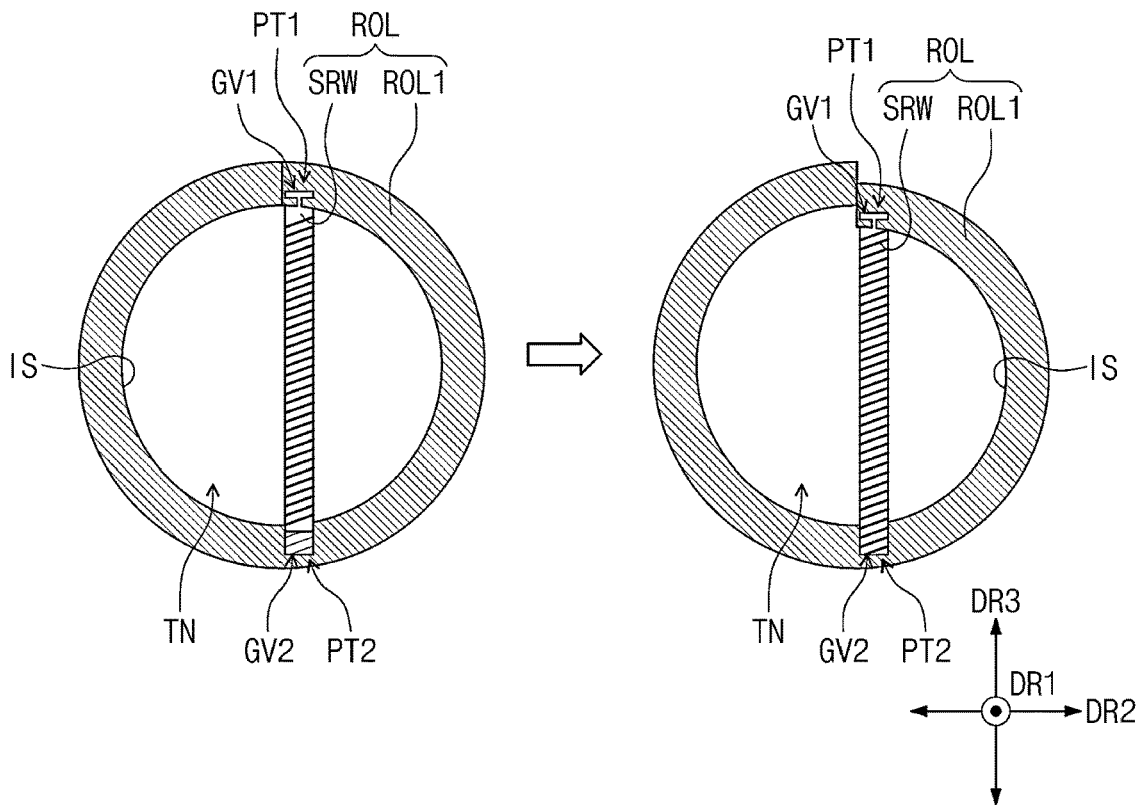

FIGS. 30 and 31 are views illustrating an embodiment of components of a roller according to the disclosure.

The following description will be focused on differences between the components illustrated in FIGS. 18 and 19 and the components illustrated in FIGS. 30 and 31.

Referring to FIGS. 30 and 31, the roller ROL may include a first roller ROL1 and a screw SWR disposed in a cavity TN of the first roller ROL1. The screw SWR may extend in the third direction DR3.

The screw SWR may be connected to a first portion PT1 of the first roller ROL1 adjacent to the boundary between one end surface OES1 and an opposite end surface OES2 and a second portion PT2 of the first roller ROL1 that faces the first portion PT1 in the cavity TN.

In FIG. 30, the first portion PT1 may be defined as a portion of the first roller ROL1 adjacent to the one end surface OES1. In FIG. 31, the first portion PT1 may be defined as a portion of the first roller ROL1 adjacent to the opposite end surface OES2.

One end of the screw SWR may be rotatably coupled to the first portion PT1, and an opposite end of the screw SWR may be rotatably coupled to the second portion PT2. The one end of the screw SWR may be rotatably coupled to a first groove GV1 defined on the inner circumferential surface IS of the first portion PT1. The opposite end of the screw SWR may be rotatably coupled to a second groove GV2 defined on the inner circumferential surface IS of the second portion PT2. The second groove GV2 may extend in the third direction DR3.

The screw SWR may be defined in a bolt shape, and the second groove GV2 may be defined in a nut shape. Accordingly, when the screw SWR rotates, the screw SWR may move in the third direction DR3 that is the extension direction of the second groove GV2.

Hereinafter, a state in which the one end surface OES1 and the opposite end surface OES2 face and overlap each other and there is no difference in height between the one end surface OES1 and the opposite end surface OES2 is defined as an initial state.

Referring to FIG. 30, in the initial state of the first roller ROL1, the opposite end of the screw SWR may contact the bottom of the second groove GV2. When the screw SWR rotates and moves upward, an upper end of the one end surface OES1 may protrude outward beyond an upper end of the opposite end surface OES2 by the screw SWR. Accordingly, a first step portion ST1 may be formed on the first roller ROL1, and similarly to that illustrated in FIG. 19, the display module DM may be connected to a partial surface of the one end surface OES1 disposed above the opposite end surface OES2.

Referring to FIG. 31, in the initial state of the first roller ROL1, the opposite end of the screw SWR may be spaced apart from the bottom of the second groove GV2. When the screw SWR rotates and moves downward, the upper end of the opposite end surface OES2 may move inward of the upper end of the one end surface OES1 by the screw SWR. Accordingly, a first step portion ST1 may be formed on the first roller ROL1, and similarly to that illustrated in FIG. 19, the display module DM may be connected to a partial surface of the one end surface OES1 disposed above the opposite end surface OES2.

According to the above description, the screw SWR may adjust the step between the one end surface OES1 and the opposite end surface OES2 by a rotary motion. The screw SWR, together with the above-described second roller ROL2, may be defined as a step adjustment part.

Figure 32:
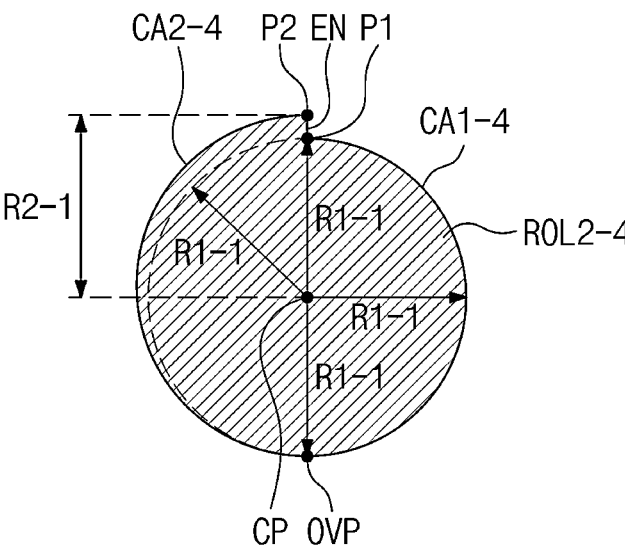
FIGS. 32 to 34 are views illustrating second rollers according to various embodiments of the disclosure.
Figure 33:
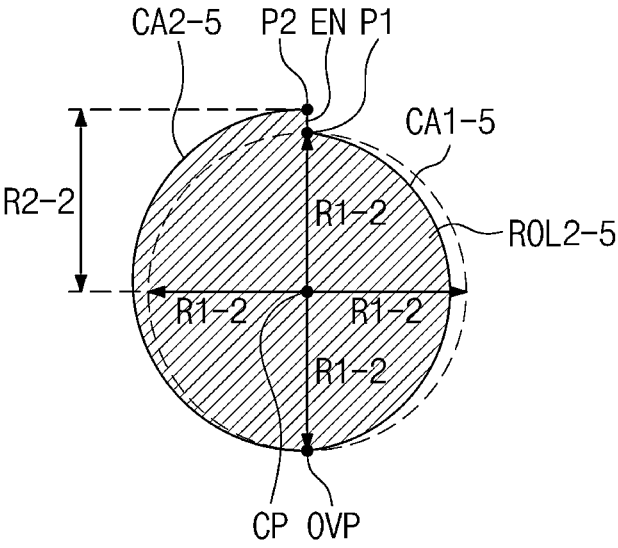
Figure 34:
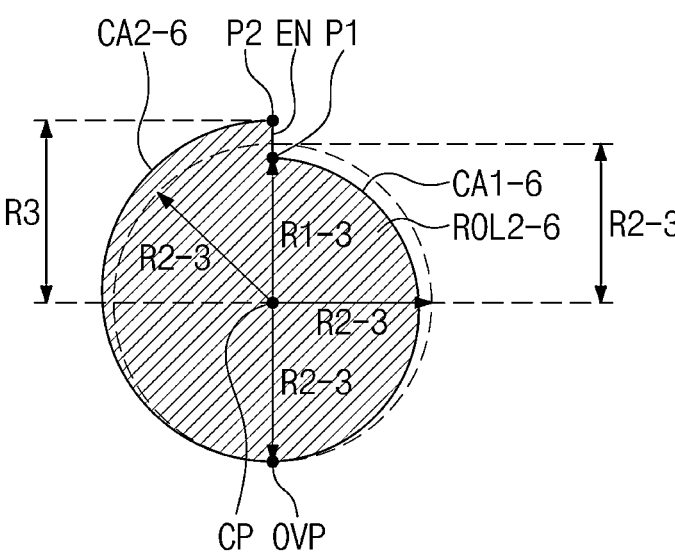

FIGS. 32 to 34 are views illustrating second rollers according to various embodiments of the disclosure.

FIGS. 32 to 34 illustrate sections corresponding to FIG. 18. The following description will be focused on differences between the second roller ROL2 illustrated in FIG. 18 and the second rollers ROL2-4, ROL2-5, and ROL2-6 illustrated in FIGS. 32 to 34.

Referring to FIG. 32, the outer circumferential surface of the second roller ROL2-4 may include a first circular arc CA1-4 disposed from a first point P1 to an overlapping point OVP and a second circular arc CA2-4 disposed from the overlapping point OVP to a second point P2. The first circular arc CA1-4 may have a constant first radius R1-1 with respect to the center point CP. The radius of the second circular arc CA2-4 with respect to the center point CP may be gradually increased from the first radius R1-1 to a second radius R2-1. Accordingly, the first circular arc CA1-4 may have a constant curvature, and the second circular arc CA2-4 may have a variable curvature.

Referring to FIG. 33, the outer circumferential surface of the second roller ROL2-5 may include a first circular arc CA1-5 disposed from a first point P1 to an overlapping point OVP and a second circular arc CA2-5 disposed from the overlapping point OVP to a second point P2. The radius of the first circular arc CA1-5 with respect to the center point CP may be gradually decreased from a first radius R1-2 and then may be gradually increased to the first radius R1-2. The radius of the second circular arc CA2-5 with respect to the center point CP may be gradually increased from the first radius R1-2 to a second radius R2-2. That is, with an approach to 360 degrees from 0 degree, the radius of the outer circumferential surface of the second roller ROL2-5 with respect to the center point CP may be decreased and then increased.

Referring to FIG. 34, the outer circumferential surface of the second roller ROL2-6 may include a first circular arc CA1-6 disposed from a first point P1 to an overlapping point OVP and a second circular arc CA2-6 disposed from the overlapping point OVP to a second point P2. The radius of the first circular arc CA1-6 with respect to the center point CP may be gradually increased from a first radius R1-3 to a second radius R2-3. The radius of the second circular arc CA2-6 with respect to the center point CP may be gradually increased from the second radius R2-3 to a third radius R3.

By the embodiments of the disclosure, the cavity extending in the first direction may be defined inside the first roller. The first roller may include the one end surface and the opposite end surface that are formed by the cut made in the first roller in the first direction, and the second roller having the step portion may be disposed in the cavity. The step portion may cause the upper end of the one end surface to protrude upward beyond the upper end of the opposite end surface. The display module may be connected to the partial surface of the one end surface disposed above the opposite end surface and may be wound around and unwound from the first roller.

Due to this structure, the display module may not be disposed on the outer circumferential surface of the first roller with a step, and thus damage to the display module may be prevented. In addition, the size of the step portion of the first roller may be adjusted in various ways depending on the rotation of the second roller. Accordingly, the size of the step portion of the first roller may be adjusted to be suitable for the thickness of the display module.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display device comprising:
a first roller in which a cavity extending in a first direction is defined, the first roller including:
    an end surface; and
    an opposite end surface facing the end surface at an incision extending in the first direction;
a step adjustment part which is disposed in the cavity and adjusts a step between the end surface and the opposite end surface by a rotary motion; and
a display module connected to the first roller and wound around an outer circumferential surface of the first roller, wherein the step adjustment part includes a second roller including a step portion by which the step between the end surface and the opposite end surface is provided, and
wherein an upper end of the end surface protrudes outward beyond an upper end of the opposite end surface by the step portion.

2. The display device of claim 1, wherein a side of the display module faces a partial surface of the end surface disposed above the opposite end surface.

3. The display device of claim 1, wherein a difference between a distance between the upper end of the end surface and the upper end of the opposite end surface and a thickness of the display module is 5% or less of the distance.

4. The display device of claim 1, wherein an outer circumferential surface of the second roller includes:
a first circular arc defined as a curve from 0 degree to a reference angle with respect to a rotational axis, the first circular arc having a radius which is variable with respect to the rotational axis; and
a second circular arc defined as a curve from the reference angle to 360 degrees with respect to the rotational axis, the second circular arc having a radius which is constant or variable with respect to the rotational axis.

5. The display device of claim 4, wherein the radius of the first circular arc with respect to the rotational axis is gradually increased from a first radius to a second radius greater than the first radius with an approach to the reference angle from 0 degree, and
wherein the second circular arc has the second radius with respect to the rotational axis from the reference angle to 360 degrees.

6. The display device of claim 5, wherein the second radius has a value obtained by adding the first radius and a distance between a point of the first circular arc corresponding to 0 degree and a point of the second circular arc corresponding to 360 degrees.

7. The display device of claim 5, wherein an inner circumferential surface of the first roller defining the cavity has the first radius with respect to the rotational axis when the upper end of the end surface and the upper end of the opposite end surface overlap each other.

8. The display device of claim 4, wherein the reference angle is set to one of angles greater than 90 degrees and less than 360 degrees.

9. The display device of claim 4, wherein a first point of the first circular arc corresponding to 0 degree and a second point of the second circular arc corresponding to 360 degrees are spaced apart from each other, the second point is disposed outward of the first point, and a first distance between the first point and the second point defines a height difference of the step portion.

10. The display device of claim 9, wherein a tangent line at the first point and a tangent line at the second point are parallel to each other.

11. The display device of claim 9, wherein the first distance is equal to a second distance between the upper end of the end surface and the upper end of the opposite end surface when the second point overlaps a boundary between the end surface and the opposite end surface.

12. The display device of claim 9, wherein the first distance is greater than a second distance between the upper end of the end surface and the upper end of the opposite end surface when the second point is spaced apart from the end surface and disposed on an inner circumferential surface of the first roller.

13. The display device of claim 12, wherein the second distance is gradually decreased as the second point moves away from the end surface.

14. The display device of claim 12, wherein the second distance corresponds to a value obtained by subtracting a fourth distance between the rotational axis and a third point of the first circular arc overlapping a lower end of the opposite end surface from a third distance between the rotational axis and a lower end of the end surface.

15. The display device of claim 4, wherein a first point of the first circular arc corresponding to 0 degree and a second point of the second circular arc corresponding to 360 degrees are defined, and the second point is spaced apart from the end surface and disposed on an inner circumferential surface of the first roller,
    wherein an inner circumferential surface of the first roller disposed from a lower end of the end surface to an inner point of the inner circumferential surface of the first roller overlapping the second point is defined as a sub-curved surface, and the sub-curved surface has a first radius with respect to a sub-center point,
    wherein the sub-center point is spaced apart from the rotational axis and disposed on a radius line connecting the rotational axis and the first point, and a distance between the sub-center point and the rotational axis is equal to a first distance between the first point and the second point, and
    wherein an angle defined by the inner point and the lower end of the end surface with respect to the rotational axis is defined as a first angle, and an inner distance between the rotational axis and the lower end of the end surface with respect to the first angle is determined by Equation below:

$$DT3(\theta 1) = \sqrt{(R1^2 - DT1^2\sin^2\theta 1)} + DT1\cos\theta 1 \qquad \text{Equation}$$

here, DT3 denotes the inner distance, $\theta 1$ denotes the first angle, $DT3(\theta 1)$ denotes the inner distance with respect to the first angle, R1 denotes the first radius, and DT1 denotes the first distance.

16. A display device comprising:
a first roller in which a cavity extending in a first direction is defined, the first roller including:
    an end surface; and an opposite end surface facing the end surface at an incision extending in the first direction;

a step adjustment part which is disposed in the cavity and adjusts a step between the end surface and the opposite end surface by a rotary motion; and a display module connected to the first roller and wound around an outer circumferential surface of the first roller, wherein the step adjustment part includes a screw rotatably connected to a first portion of the first roller adjacent to a boundary between the end surface and the opposite end surface and a second portion of the first roller facing the first portion.

17. The display device of claim 16, wherein the first portion is defined as a portion of the first roller adjacent to the end surface, and an upper end of the end surface protrudes outward beyond an upper end of the opposite end surface by the screw.

18. The display device of claim 16, wherein the first portion is defined as a portion of the first roller adjacent to the opposite end surface, and an upper end of the opposite end surface is recessed inward of an upper end of the end surface by the screw.

19. A display device comprising:

a first roller in which a cavity extending in a first direction is defined and a cut made in the first roller in the first direction;

a second roller disposed in the cavity, the second roller including:

a first circular arc having a variable curvature; and a second circular arc extending from the first circular arc and define a step portion together with the first circular arc, the second circular arc having a curvature which is constant or variable; and a display module connected to the first roller and wound around an outer circumferential surface of the first roller, wherein an upper end of the end surface protrudes outward beyond an upper end of the opposite end surface by the step portion.

\* \* \* \* \*